United States Patent
Ho et al.

(10) Patent No.: US 7,688,615 B2
(45) Date of Patent: Mar. 30, 2010

(54) MAGNETIC RANDOM ACCESS MEMORY, MANUFACTURING METHOD AND PROGRAMMING METHOD THEREOF

(75) Inventors: Chia-Hua Ho, Hsinchu County (TW); Kuang-Yeu Hsieh, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 189 days.

(21) Appl. No.: 11/949,814

(22) Filed: Dec. 4, 2007

(65) Prior Publication Data

US 2009/0141543 A1 Jun. 4, 2009

(51) Int. Cl.
*G11C 11/00* (2006.01)
(52) U.S. Cl. .................. 365/157; 365/158; 365/171; 365/97; 365/209
(58) Field of Classification Search .............. 365/158, 365/157, 171, 97, 209
See application file for complete search history.

(56) References Cited

U.S. PATENT DOCUMENTS

2004/0195602 A1* 10/2004 Yoda et al. ............. 257/295

2005/0189574 A1 9/2005 Nguyen et al.
2005/0213376 A1* 9/2005 Ohmori et al. ........... 365/173

FOREIGN PATENT DOCUMENTS

CN 1947272 4/2007
TW 457483 10/2001

OTHER PUBLICATIONS

English language translation of abstract of TW 457483 (published Oct. 1, 2001).
English language translation of abstract of CN 1947272 (published Apr. 11, 2007).

* cited by examiner

*Primary Examiner*—Thong Q Le
(74) *Attorney, Agent, or Firm*—Thomas, Kayden, Horstemeyer & Risley

(57) ABSTRACT

A magnetic random access memory (MRAM) and a manufacturing method and a programming method thereof are provided. The magnetic random access memory comprises a first magnetic tunnel junction structure and a second magnetic tunnel junction structure. The second magnetic tunnel junction structure is electrically connected with the first magnetic tunnel junction structure, and the volume of the second magnetic tunnel junction structure is smaller than that of the first magnetic tunnel junction structure.

34 Claims, 21 Drawing Sheets

MAGNETIC RANDOM ACCESS MEMORY, MANUFACTURING METHOD AND PROGRAMMING METHOD THEREOF

BACKGROUND OF THE INVENTION

1. Field of the Invention

The invention relates in general to a memory and a manufacturing method and a programming method thereof, and more particularly to a magnetic random access memory (MRAM) and a manufacturing method and a programming method thereof.

2. Description of the Related Art

Along with the wide application of consumer electronic products, the requirements of the processing speed and the capacity of the storing digital data is higher and higher. The memory plays an important role in the consumer electronic products. Consumers develop higher and higher requirements of the memory including the power consumption, the cost, read/write speed and the erasing times. Therefore, several new invention memories are presented to fit the needs of different market segmentations with an aim to break through the current memory restrictions and become the mainstream technology for the new generation memory.

Examples of current memories include dynamic random access memory (DRAM), flash memory (Flash Memory), static random access memory (SRAM) and magnetic random access memory (MRAM). The magnetic random access memory (MRAM) is a new invention non-volatile memory, having the same non-volatile characteristics as that of the Flash memory. Moreover, the magnetic random access memory (MRAM) is comparable to the static random access memory (SRAM) in terms of read/write speed. The unit memory area of the magnetic random access memory (MRAM) is further comparable to that of the dynamic random access memory (DRAM). Therefore, the magnetic random access memory has been accepted as a new generation memory with high potentials.

In the magnetic random access memory (MRAM), data are programmed through the spin-transferring of current or electron current. When the magnetic random access memory has a large resistance, the magnetic random access memory is defined as "0". To the contrary, when the magnetic random access memory has a small resistance, the magnetic random access memory is defined as "1". That is, a conventional magnetic random access memory can store 1-bit data. If the to-be-programmed data has 4 bits, the data of "0" or "1" needs to be programmed to four conventional magnetic random access memories. As the electronic products are designed to meet the requirements of lightweight, slimness, compactness, and speed, conventional magnetic random access memory can only program 1-bit data, not only occupying a larger volume but also further reducing the programming speed. Therefore, how to effectively reduce the volume and improve the programming speed of the magnetic random access memory has become an imminent issue to be resolved.

SUMMARY OF THE INVENTION

The invention is directed to a magnetic random access memory (MRAM) and a manufacturing method and a programming method thereof. By electrically connecting a first magnetic tunnel junction structure with a second magnetic tunnel junction structure whose volume is different from that of the first magnetic tunnel junction structure and by controlling the value and direction of the first current and the second current, the first magnetic tunnel junction structure and the second magnetic tunnel junction structure create four data types, namely "11", "10", "01" and "00". Therefore, each magnetic random access memory has 2-bit data storage, not only decreasing the space required by the magnetic random access memory, but also increasing the programming speed of the magnetic random access memory.

According to a first aspect of the present invention, a magnetic random access memory (MRAM) is provided. The magnetic random access memory comprises a first magnetic tunnel junction (MTJ) structure and a second magnetic tunnel junction structure. The second magnetic tunnel junction structure is electrically connected with the first magnetic tunnel junction structure, and the volume of the second magnetic tunnel junction structure is smaller than that of the first magnetic tunnel junction structure.

According to a second aspect of the present invention, a manufacturing method of a magnetic random access memory is provided. The manufacturing method comprises the following steps. (a). A substrate is provided. (c). A first lower magnetic pinned layer, a first magnetic free layer, a first upper magnetic pinned layer, a second lower magnetic pinned layer, a second magnetic free layer and a second upper magnetic pinned layer are formed on the substrate. (d). A mask is taken as an obstacle, and the second upper magnetic pinned layer, the second magnetic free layer and the second lower magnetic pinned layer are etched so as to form a second magnetic tunnel junction structure. (e). The first upper magnetic pinned layer, the first magnetic free layer and the first lower magnetic pinned layer are etched so as to form a first magnetic tunnel junction structure.

According to a third aspect of the present invention, a programming method of a magnetic random access memory is provided. The programming method of a magnetic random access memory at least comprises the following steps. (I). A first magnetic tunnel junction structure and a second magnetic tunnel junction structure are provided and connected, wherein the volume of the second magnetic tunnel junction structure is smaller than that of the first magnetic tunnel junction structure. (II). A first current flowing through a first magnetic tunnel junction structure and a second magnetic tunnel junction structure is provided.

The invention will become apparent from the following detailed description of the preferred but non-limiting embodiments. The following description is made with reference to the accompanying drawings.

DETAILED DESCRIPTION OF THE INVENTION

Preferred embodiments are disclosed below for elaborating the details of the invention. However, the invention is not limited to the embodiments, and the embodiments are for elaborating the invention not for limiting the scope of protection of the invention. Moreover, secondary elements are omitted in the embodiments to highlight the characteristics of the invention.

First Embodiment

Figure 1:
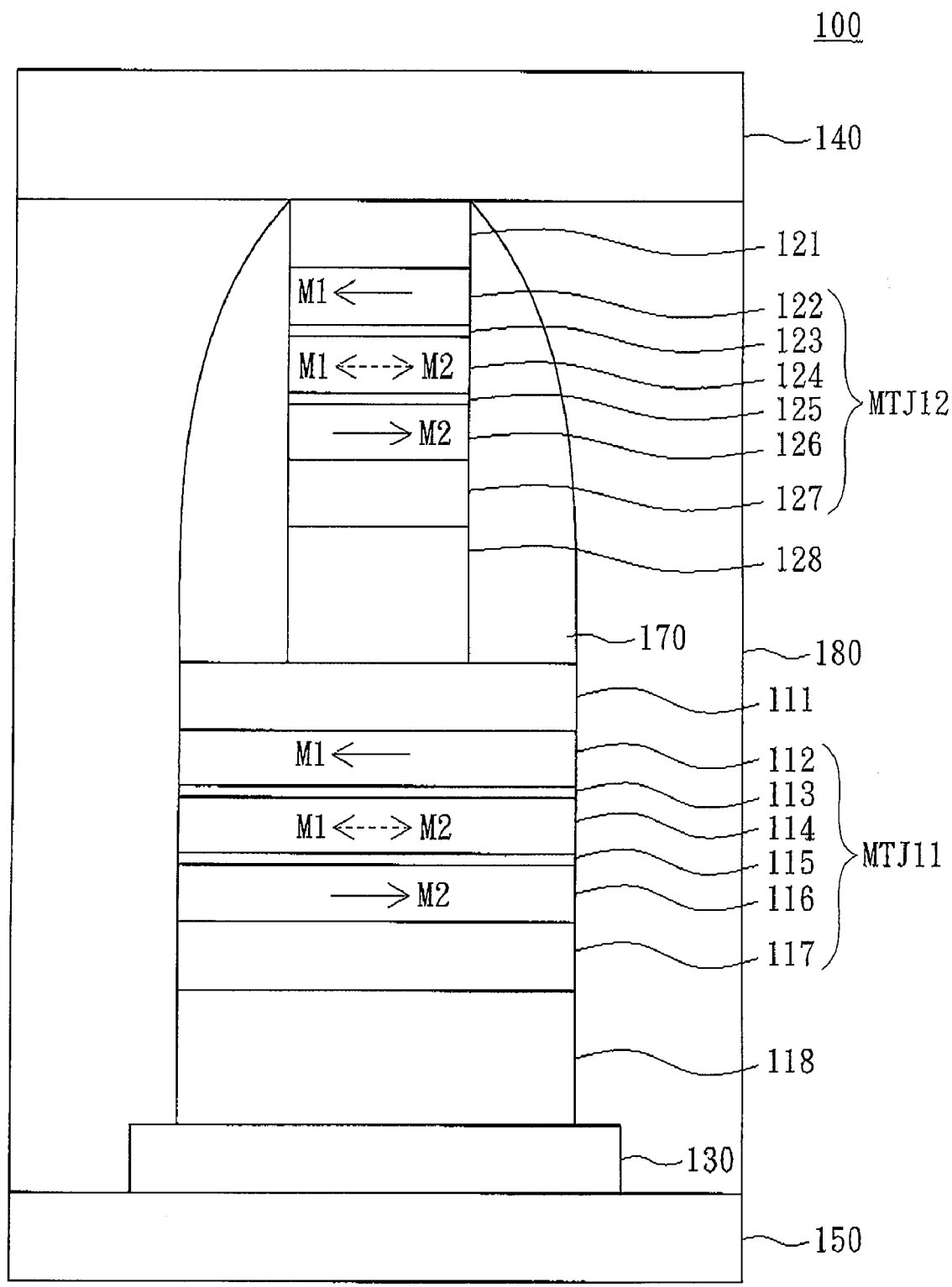
FIG. 1 is a perspective of a magnetic random access memory according to a first embodiment of the invention.

Referring to FIG. 1, a perspective of a magnetic random access memory (MRAM) 100 according to a first embodiment of the invention is shown. The magnetic random access memory 100 comprises a first magnetic tunnel junction (MTJ) structure MTJ11 and a second magnetic tunnel junction structure MTJ12. The second magnetic tunnel junction structure MTJ12 is electrically in-series connected with the first magnetic tunnel junction structure MTJ11. In the present embodiment of the invention, the second magnetic tunnel junction structure MTJ12 is stacked on the first magnetic tunnel junction structure MTJ11, and the volume of the second magnetic tunnel junction structure MTJ12 is smaller than that of the first magnetic tunnel junction structure MTJ11. The first magnetic tunnel junction structure MTJ11 may also be stacked on the second magnetic tunnel junction structure MTJ12. As long as two different sized magnetic tunnel junction structures MTJ11 and MTJ12 are designed to be electrically connected together are within the scope of technology of the invention.

The first magnetic tunnel junction structure MTJ11 comprises a first upper magnetic pinned layer 112, a first magnetic free layer 114 and a first lower magnetic pinned layer 116. The magnetic direction of the first upper magnetic pinned layer 112 is opposite to that of the first lower magnetic pinned layer 116. The first upper magnetic pinned layer 112 is pinned at a first magnetic direction M1, the first lower magnetic pinned layer 116 is pinned at a second magnetic direction M2, and the first magnetic free layer 114 may be magnetized to have the same magnetic direction with the first magnetic direction M1 or the second magnetic direction M2.

The second magnetic tunnel junction structure MTJ12 comprises a second upper magnetic pinned layer 122, a second magnetic free layer 124 and a second lower magnetic pinned layer 126. The magnetic direction of the second upper magnetic pinned layer 122 is opposite to that of the second lower magnetic pinned layer 126. The second upper magnetic pinned layer 122 is pinned at the first magnetic direction M1, the second lower magnetic pinned layer 126 is pinned at the second magnetic direction M2, and the second magnetic free layer 124 may be magnetized to have the same magnetic direction with the first magnetic direction M1 or the second magnetic direction M2.

That is, in the present embodiment of the invention, the first upper magnetic pinned layer 112, the first lower magnetic pinned layer 116, the second upper magnetic pinned layer 122 and the second lower magnetic pinned layer 126 are respectively pinned at the first magnetic direction M1, the second magnetic direction M2, the first magnetic direction M1 and the second magnetic direction M2. In FIG. 1, the magnetic directions of the first magnetic free layer 114 and the second magnetic free layer 124 denoted in dotted line can be magnetized as one of the first magnetic direction M1 or the second magnetic direction M2. The first upper magnetic pinned layer 112, the first magnetic free layer 114 and the first lower magnetic pinned layer 116 substantially have the same width. The second upper magnetic pinned layer 122, the second magnetic free layer 124 and the second lower magnetic pinned layer 126 substantially have the same width.

In greater details, when the first magnetic tunnel junction structure MTJ11 and the second magnetic tunnel junction structure MTJ12 are at the programming mode, the critical current density $j_c$ of the current is obtained from the following formula:

$$j_c = J_{c0}\left(1 - \frac{kT}{E}\ln\left(\frac{\tau_p}{\tau_0}\right)\right); E = \frac{M_s V H_k}{2} \quad (1)$$

Wherein, T denotes temperature, $\tau_p$ denotes programming pulse time, $\tau_0$ denotes critical pulse time, $J_{c0}$ denotes a constant. E denotes anisotropic energy, $M_s$ denotes saturation magnetization, V denotes total volume, and $H_k$ denotes anisotropic magnetic field. By converting the formulas (1), a new formula is obtained as below:

$$j_c = \left(\frac{2e}{\hbar}\right)\left(\frac{\alpha}{\eta}\right)VM_s(H + H_k + 2\pi M_s) \quad (2)$$

Wherein, e, $\alpha$ and $\hbar$ denote constants, $\eta$ denotes magnetic polarization of ferromagnetic material, H denotes strength of an external magnetic field.

The formula (2) is simplified as:

$$j_c \propto C_1(V + C_2) \quad (3)$$

Wherein, $C_1$ and $C_2$ denote constants. Let experimental data be taken for example, when the cross-sectional area of the magnetic tunnel junction structure equals 0.2×0.3 μm$^2$, the programming current equals 600 μA, and the critical current density $j_c$ equals 1.3×10$^6$ A/cm$^2$. When the cross-sectional area of the magnetic tunnel junction structure equals 0.1×0.15 μm$^2$, the programming current equals 150 μA, and the critical current density $j_c$ equals 9.5×10$^5$ A/cm$^2$. That is, the volume V is proportional to the critical current density $j_c$ of the current. The larger the volume V; the larger the critical current density $j_c$ and the conductance ($\equiv$1/resistance). To the contrary, the smaller the volume V, the smaller the critical current density and the conductance.

In the present embodiment of the invention, the volume of the second magnetic tunnel junction structure MTJ12 is substantially smaller than two thirds of the volume of the first magnetic tunnel junction structure MTJ11. Therefore, the resistance of the second magnetic tunnel junction structure MTJ12 is higher than that of the first magnetic tunnel junction structure MTJ11.

The first magnetic tunnel junction structure MTJ11 further comprises a first spacer layer 115 disposed between the first lower magnetic pinned layer 116 and the first magnetic free layer 114. The thickness of the first spacer layer 115 approximately ranges between 0.7 nm~3.0 nm, such that a current can flow through the first spacer layer 115. When the magnetic direction of the first lower magnetic pinned layer 116 is different from that of the first magnetic free layer 114, the first magnetic tunnel junction structure MTJ11 has a high resistance nR. To the contrary, when the magnetic direction of the first lower magnetic pinned layer 116 is the same with that of the first magnetic free layer 114, the first magnetic tunnel junction structure MTJ11 has a lower resistance R. The factor n (n>1) relates to the tunneling magnetoresistance (TMR) of the first magnetic tunnel junction MTJ11. The high resistance nR and the lower resistance R are respectively defined as "0" and "1". By changing the magnetic direction of the first magnetic free layer 114, then "0" or "1" can be programmed to the first magnetic tunnel junction structure MTJ11.

Likewise, the second magnetic tunnel junction structure MTJ12 further comprises a second spacer layer 125 disposed between the second lower magnetic pinned layer 126 and the second magnetic free layer 124. The thickness of the second spacer layer 125 approximately ranges between 0.7 nm~3.0 nm, such that the current can flow through the second spacer layer 125. When the magnetic direction of the second lower magnetic pinned layer 126 is different from that of the second magnetic free layer 124, the second magnetic tunnel junction structure MTJ12 has a higher resistance nfR (f>1). The factor n (n>1) relates to the tunneling magnetoresistance of the second magnetic tunnel junction MTJ12. As the volume of the second magnetic tunnel junction structure MTJ12 is smaller than that of the first magnetic tunnel junction structure MTJ11, the higher resistance nfR of the second magnetic tunnel junction structure MTJ12 is f times than that of the high resistance nR of the first magnetic tunnel junction structure MTJ11 (f>1). To the contrary, when the magnetic direction of the second lower magnetic pinned layer 126 is the same with that of the second magnetic free layer 124, the second magnetic tunnel junction structure MTJ12 has a low resistance fR. As the volume of the second magnetic tunnel junction structure MTJ12 is smaller than the first magnetic tunnel junction structure MTJ11, the small resistance fR of the second magnetic tunnel junction structure MTJ12 is f times than that of the lower resistance R of the first magnetic tunnel junction structure MTJ11 (f>1). The higher resistance nfR and the low resistance fR are respectively defined as "0" and "1". By changing the magnetic direction of the second magnetic free layer 124, then "0" or "1" can be programmed to the second magnetic tunnel junction structure MTJ12.

According to the above disclosure, the first magnetic tunnel junction structure MTJ11 can be changed to a high resistance nR or a lower resistance R, and the second magnetic tunnel junction structure MTJ12 can be changed to a higher resistance nfR or a low resistance fR. Therefore, by combining the above two changes, the magnetic random access memory 100 can be changed to have four combinations of nR+nfR, nR+fR, R+nfR and R+fR. And the magnetic random access memory 100 can be defined as "00", "01", "10" and "11" respectively according to the denotations of "0" and "1" disclosed above. As the resistance denoted by "01" is not the same with that denoted by "10", the magnetic random access memory 100 has 2-bit storage characteristics.

In greater details, the first magnetic tunnel junction structure MTJ11 further comprises a first anti-ferromagnetic layer 117 and a first barrier layer 113. The first anti-ferromagnetic layer 117 is adjacent to the first lower magnetic pinned layer 116 for pinning the first lower magnetic pinned layer 116 at the second magnetic direction M2. The first barrier layer 113 is disposed between the first upper magnetic pinned layer 112 and the first magnetic free layer 114 for avoiding magnetic interference between the first upper magnetic pinned layer 112 and the first magnetic free layer 114. The first barrier layer 113 is in-general the thin non-magnetic metal, such as Ru, Ir, etc. with thickness of ~0.7 nm~2 nm.

Likewise, the second magnetic tunnel junction structure MTJ12 further comprises a second anti-ferromagnetic layer 127 and a second barrier layer 123. The second lower anti-ferromagnetic layer 127 is adjacent to the second lower magnetic pinned layer 126 for pinning the second lower magnetic pinned layer 126 at the second lower magnetic direction M2. The second barrier layer 123 is disposed between the second upper magnetic pinned layer 122 and the second magnetic free layer 124 for avoiding magnetic interference between the second upper magnetic pinned layer 122 and the second magnetic free layer 124. The second barrier layer 123 is in-general the thin non-magnetic metal, such as Ru, Ir, etc. with thickness of ~0.7 nm~2 nm.

In addition, the magnetic random access memory 100 further comprises a first electrode layer 130 and a second electrode layer. The first magnetic tunnel junction structure MTJ11 further comprises a first upper electrode layer 111 and a first lower electrode layer 118. The first upper electrode layer 111 is disposed near the first upper magnetic pinned layer 112. The first lower electrode layer 118 is disposed near the first lower magnetic pinned layer 116. The second magnetic tunnel junction structure MTJ12 further comprises a second upper electrode layer 121 and a second lower electrode layer 128. The second upper electrode layer 121 is disposed near the second upper magnetic pinned layer 122. The second lower electrode layer 128 is disposed near the second lower magnetic pinned layer 127. The first electrode layer 130 is electrically in-series connected with the first magnetic tunnel junction structure MTJ11 via the first lower electrode layer 118. The second electrode layer 140 is electrically in-series connected with the second magnetic tunnel junction structure MTJ12 via the second upper electrode layer 121. The first upper electrode layer 111 and the second lower electrode layer 128 are used for electrically connected the first magnetic tunnel junction structure MTJ11 and the second magnetic tunnel junction structure MTJ12. The first electrode layer 130 and the second electrode layer 140 are used for providing a current flowing through the first magnetic tunnel junction structure MTJ11 and the second magnetic tunnel junction structure MTJ12.

As for how the magnetic random access memory 100 of the present embodiment of the invention changes among the four data types of "00", "01", "10" and "11" is elaborated below. The magnetic random access memory programming method of the invention is exemplified by the magnetic random access memory 100 of the present embodiment of the invention. However, the exemplification is not for limiting the programming method of the invention.

Figure 2A:
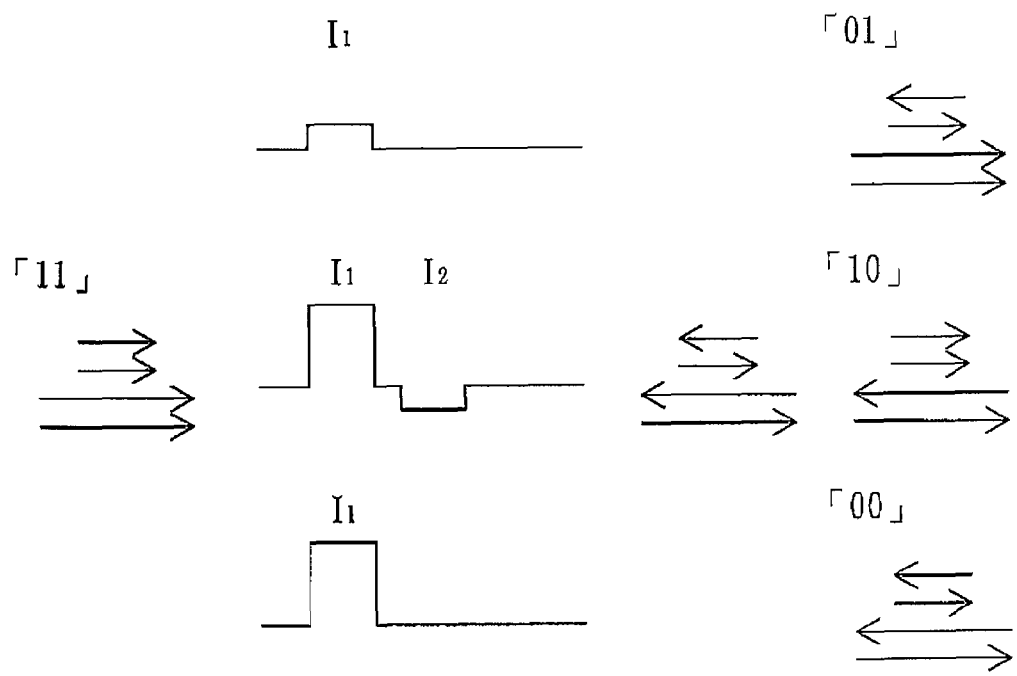
FIG. 2A is a perspective showing the magnetic random access memory according to the first embodiment of the invention programs "01", "10" or "00" from "11"

Referring to FIG. 2A, a perspective showing the magnetic random access memory 100 according to the first embodiment of the invention programs "01", "10" or "0" from "11" is shown. When the magnetic random access memory 100 is "11", the magnetic direction of the first magnetic free layer 114 is the same with that of the first lower magnetic pinned layer 116, and the magnetic direction of the second magnetic free layer 124 is the same with that of the second lower magnetic pinned layer 126, as indicated in the left-hand side of FIG. 2A.

When the magnetic random access memory 100 programs "01" from "11", a first current $I_1$ flowing through the first magnetic tunnel junction structure MTJ11 and the second magnetic tunnel junction structure MTJ12 is provided.

Wherein, $|I_{AP}(MTJ12)|<|I_1|<|I_{AP}(MTJ11)|$, the absolute value of the first current $I_1$ ranges between the absolute value of the first magnetic critical value $I_{AP}(MTJ11)$ and the absolute value of the second magnetic critical value $I_{AP}(MTJ12)$, the first current $I_1$ is large enough to turn over the second magnetic free layer 124 but still not large enough to turn over the first magnetic free layer 114.

Furthermore $I_1>0$, the first current $I_1$ flows to the second magnetic tunnel junction structure MTJ12 from the first magnetic tunnel junction structure MTJ11, such that the second magnetic free layer 124 is magnetized to have same magnetic direction with the second upper magnetic pinned layer 122. In the present embodiment of the invention, the first current $I_1$ being positive implies that the first current $I_1$ flows to the second magnetic tunnel junction structure MTJ12 from the first magnetic tunnel junction structure MTJ11. Meanwhile, "01" is programmed to the magnetic random access memory 100.

When the magnetic random access memory 100 programs "10" from "11", a first current $I_1$ and a second current $I_2$ flowing through a first magnetic tunnel junction structure MTJ11 and a second magnetic tunnel junction structure MTJ12 are sequentially provided.

Wherein, $|I_{AP}(MTJ11)|<|I_1|$, the absolute value of the first current $I_1$ is larger than the absolute of the first magnetic critical value $I_{AP}(MTJ11)$, the first current $I_1$ is large enough to turn over the first magnetic free layer 114 and the second magnetic free layer 124.

Furthermore, $I_1>0$, the first current $I_1$ flows to the second magnetic tunnel junction structure MTJ12 from the first magnetic tunnel junction structure MTJ11, such that the first magnetic free layer 114 is magnetized to have the same magnetic direction with the first upper magnetic pinned layer 112, and the second magnetic free layer 124 is magnetized to have the same magnetic direction with the second upper magnetic pinned layer 122.

Next, $|I_{AP}(MTJ12)|<|I_2|<|I_{AP}(MTJ11)|$, the absolute value of the second current $I_2$ ranges between the absolute value of the first magnetic critical value $I_{AP}(MTJ11)$ and the absolute value of the second magnetic critical value $I_{AP}(MTJ12)$, the second current $I_2$ is large enough to turn over the second magnetic free layer 124 but still not large enough to turn over the first magnetic free layer 114.

Furthermore, $I_2<0$, the second current $I_2$ flows to the first magnetic tunnel junction structure MTJ11 from the second magnetic tunnel junction structure MTJ12, such that the second magnetic free layer 124 is magnetized to have the same magnetic direction with the second lower magnetic pinned layer 126. Meanwhile, "10" is programmed to the magnetic random access memory 100.

When the magnetic random access memory 100 programs "00" from "11", a first current $I_1$ flowing through a first magnetic tunnel junction structure MTJ11 and a second magnetic tunnel junction structure MTJ12 is provided.

Wherein, $|I_{AP}(MTJ11)|<|I_1|$, the absolute value of the first current $I_1$ is larger than the absolute value of the first magnetic critical value $I_{AP}(MTJ11)$, the first current $I_1$ is large enough to turn over the first magnetic free layer 114 and the second magnetic free layer 124.

Furthermore, $I_1>0$, the first current $I_1$ flows to the second magnetic tunnel junction structure MTJ12 from the first magnetic tunnel junction structure MTJ11, such that the first magnetic free layer 114 is magnetized to have the same magnetic direction with the first upper magnetic pinned layer 112 and the second magnetic free layer 124 is magnetized to have the same magnetic direction with the second upper magnetic pinned layer 122. Meanwhile, "00" is programmed to the magnetic random access memory 100.

Figure 2B:
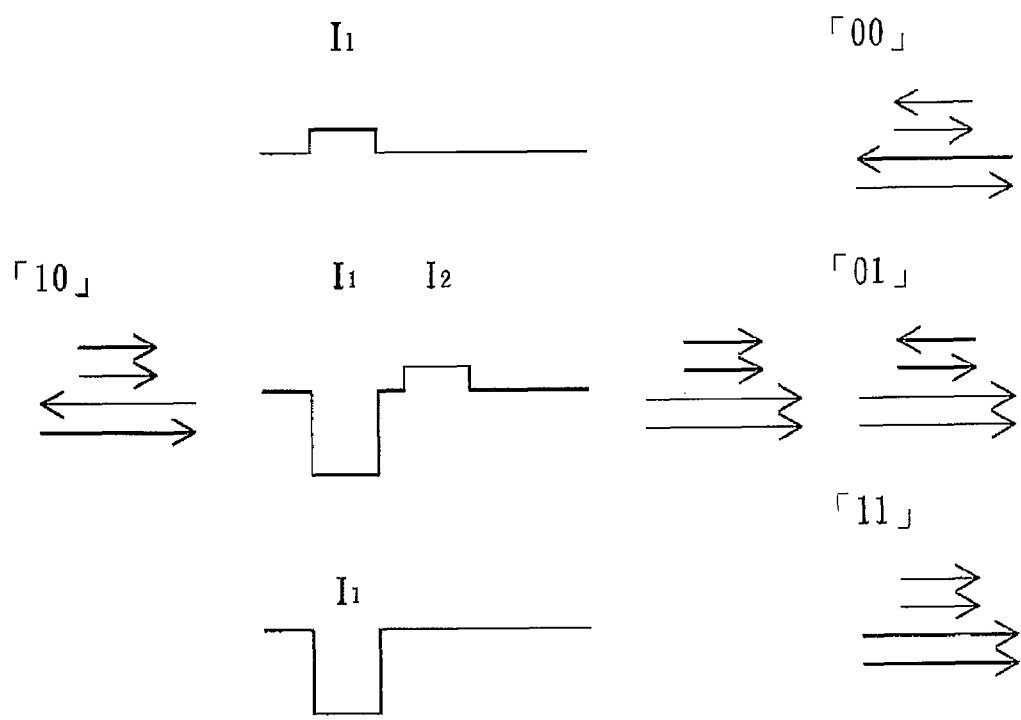
FIG. 2B is a perspective showing the magnetic random access memory according to the first embodiment of the invention programs "00", "01" or "11" from "10"

Referring to FIG. 2B, a perspective showing the magnetic random access memory 100 according to the first embodiment of the invention programs "00", "01" or "11" from "10" is shown. When the magnetic random access memory 100 is "10", the magnetic direction of the first magnetic free layer 114 is different from that of the first lower magnetic pinned layer 116, and the magnetic direction of the second magnetic free layer 124 is the same with that of the second lower magnetic pinned layer 126, as indicated in the left-hand side of FIG. 2B.

When the magnetic random access memory 100 programs "00" from "10", a first current $I_1$ flowing through a first magnetic tunnel junction structure MTJ11 and a second magnetic tunnel junction structure MTJ12 is provided.

Wherein, $|I_{AP}(MTJ12)|<|I_1|<|I_{AP}(MTJ11)|$, the absolute value of the first current $I_1$ ranges between the absolute value of the first magnetic critical value $I_{AP}(MTJ11)$ and the absolute value of the second magnetic critical value $I_{AP}(MTJ12)$, the first current $I_1$ is large enough to turn over the second magnetic free layer 124 but still not large enough to turn over the first magnetic free layer 114.

Furthermore, $I_1>0$, the first current $I_1$ flows to the second magnetic tunnel junction structure MTJ12 from the first magnetic tunnel junction structure MTJ11, such that the second magnetic free layer 124 is magnetized to have the same magnetic direction with the second upper magnetic pinned layer 122.

When the magnetic random access memory 100 programs "01" from "10", a first current $I_1$ and a second current $I_2$ flowing through a first magnetic tunnel junction structure MTJ11 and a second magnetic tunnel junction structure MTJ12 are sequentially provided.

Wherein, $|I_{AP}(MTJ11)|<|I_1|$, the absolute value of the first current $I_1$ is larger than the absolute value of the first magnetic critical value $I_{AP}(MTJ11)$, the first current $I_1$ is large enough to turn over the first magnetic free layer 114 and the second magnetic free layer 124.

Furthermore, $I_1<0$, the first current $I_1$ flows to the first magnetic tunnel junction structure MTJ11 from the second magnetic tunnel junction structure MTJ12, such that the first magnetic free layer 114 is magnetized to have the same magnetic direction with the first lower magnetic pinned layer 116 and the second magnetic free layer 124 is magnetized to have the same magnetic direction with the second lower magnetic pinned layer 126.

Next, $|I_{AP}(MTJ12)|<|I_2|<|I_{AP}(MTJ11)|$, the absolute value of the second current $I_2$ ranges between the absolute value of the first magnetic critical value $I_{AP}(MTJ11)$ and the absolute value of the second magnetic critical value $I_{AP}(MTJ12)$, the second current $I_2$ is large enough to turn over the second magnetic free layer 124 but still not large enough to turn over the first magnetic free layer 114.

Furthermore, $I_2>0$, the second current $I_2$ flows to the second magnetic tunnel junction structure MTJ12 from the first magnetic tunnel junction structure MTJ11, such that the second magnetic free layer 124 is magnetized to have the same magnetic direction with the second upper magnetic pinned layer 122. Meanwhile, "01" is programmed to the magnetic random access memory 100.

When the magnetic random access memory 100 programs "11" from "10", a first current $I_1$ flowing through a first magnetic tunnel junction structure MTJ11 and a second magnetic tunnel junction structure MTJ12 is provided.

Wherein $|I_{AP}(MTJ11)|<|I_1|$, the absolute value of the first current $I_1$ is larger than the absolute of the first magnetic critical value $I_{AP}(MTJ11)$, the first current $I_1$ is large enough to turn over the first magnetic free layer 114 and the second magnetic free layer 124.

Furthermore, $I_1<0$, the first current $I_1$ flows to the first magnetic tunnel junction structure MTJ11 from the second magnetic tunnel junction structure MTJ12, such that the first magnetic free layer 114 is magnetized to have the same magnetic direction with the first lower magnetic pinned layer 116, and the second magnetic free layer 124 is magnetized to have the same magnetic direction with the second lower magnetic pinned layer 126. Meanwhile, "00" is programmed to the magnetic random access memory 100.

Figure 2C:
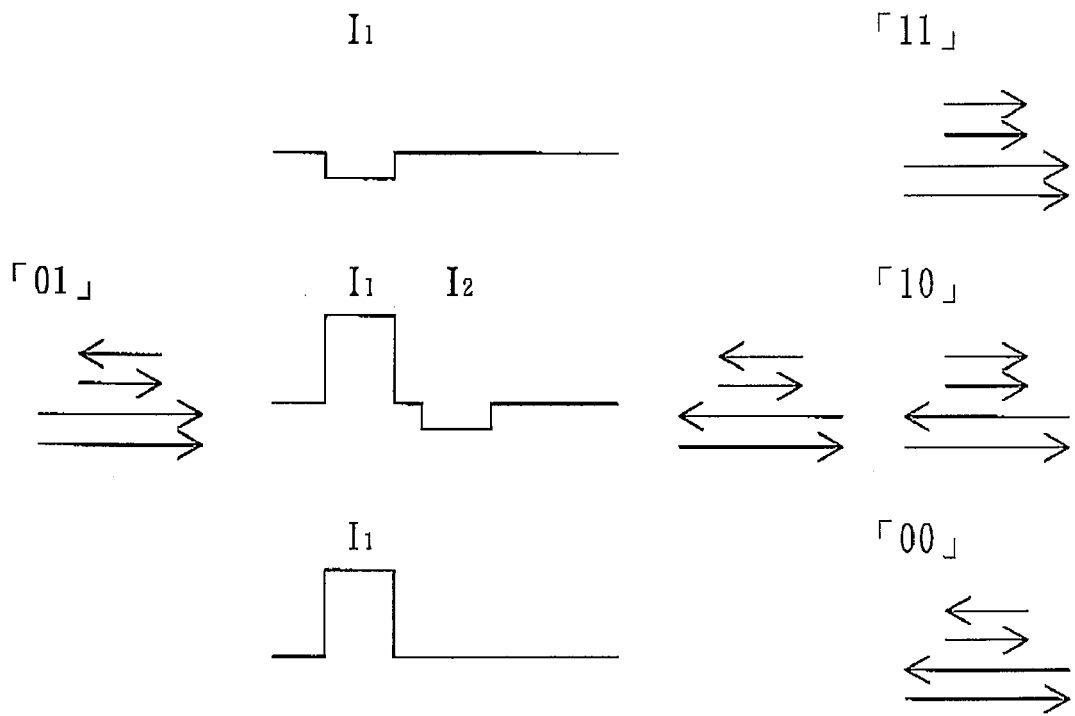
FIG. 2C is a perspective showing the magnetic random access memory according to the first embodiment of the invention programs "11", "10" or "00" from "01"

Referring to FIG. 2C, a perspective showing the magnetic random access memory 100 according to the first embodiment of the invention programs "11", "10" or "00" from "01" is shown. When the magnetic random access memory 100 is "01", the magnetic direction of the first magnetic free layer 114 is the same with that of the first lower magnetic pinned layer 116, and the magnetic direction of the second magnetic free layer 124 is different from that of the second lower magnetic pinned layer 126, as indicated in the left-hand side of FIG. 2C.

When the magnetic random access memory 100 programs "11" from "01", a first current $I_1$ flowing through a first magnetic tunnel junction structure MTJ11 and a second magnetic tunnel junction structure MTJ12 is provided.

Wherein, $|I_{AP}(MTJ12)|<|I_1|<|I_{AP}(MTJ11)|$, the absolute value of the first current $I_1$ ranges between the absolute value of the first magnetic critical value $I_{AP}(MTJ11)$ and the absolute value of the second magnetic critical value $I_{AP}(MTJ12)$, the first current $I_1$ is large enough to turn over the second magnetic free layer 124 but still not large enough to turn over the first magnetic free layer 114.

Furthermore, $I_1<0$, the first current $I_1$ flows to the first magnetic tunnel junction structure MTJ11 from the second magnetic tunnel junction structure MTJ12, such that the second magnetic free layer 124 is magnetized to have the same magnetic direction with the second lower magnetic pinned layer 126. Meanwhile, "11" is programmed to the magnetic random access memory 100.

When the magnetic random access memory 100 programs "10" from "01", the first current $I_1$ and the second current $I_2$ flowing through the first magnetic tunnel junction structure MTJ11 and the second magnetic tunnel junction structure MTJ12 are sequentially provided.

Wherein, $|I_{AP}(MTJ11)|<|I_1|$, the absolute value of the first current $I_1$ is larger than the absolute of the first magnetic critical value $I_{AP}(MTJ11)$, the first current $I_1$ large enough to turn over the first magnetic free layer 114 and the second magnetic free layer 124.

Furthermore, $I_1>0$, the first current $I_1$ flows to the second magnetic tunnel junction structure MTJ12 from the first magnetic tunnel junction structure MTJ11, such that the first magnetic free layer 114 is magnetized to have the same magnetic direction with the first upper magnetic pinned layer 112, and the second magnetic free layer 124 is magnetized to have the same magnetic direction with the second upper magnetic pinned layer 122.

Next, $|I_{AP}(MTJ12)|<|I_2|<|I_{AP}(MTJ11)|$, the absolute value of the second current $I_2$ ranges between the absolute value of the first magnetic critical value $I_{AP}(MTJ11)$ and the absolute value of the second magnetic critical value $I_{AP}(MTJ12)$, the second current $I_2$ is large enough to turn over the second magnetic free layer 124 but still not large enough to turn over the first magnetic free layer 114.

Furthermore, $I_2<0$, the second current $I_2$ flows to the first magnetic tunnel junction structure MTJ11 from the second magnetic tunnel junction structure MTJ12, such that the second magnetic free layer 124 is magnetized to have the same magnetic direction with the second lower magnetic pinned layer 126. Meanwhile, "10" is programmed to the magnetic random access memory 100.

When the magnetic random access memory 100 programs "00" from "01", a first current $I_1$ flowing through a first magnetic tunnel junction structure MTJ11 and a second magnetic tunnel junction structure MTJ12 is provided.

Wherein, $|I_{AP}(MTJ11)|<|I_1|$, the absolute value of the first current $I_1$ is larger than the absolute of the first magnetic critical value $I_{AP}(MTJ11)$, the first current $I_1$ is large enough to turn over the first magnetic free layer 114 and the second magnetic free layer 124.

Furthermore, $I_1>0$, the first current $I_1$ flows to the second magnetic tunnel junction structure MTJ12 from the first magnetic tunnel junction structure MTJ11, such that the first magnetic free layer 114 is magnetized to have the same magnetic direction with the first upper magnetic pinned layer 112, and the second magnetic free layer 124 is magnetized to have the same magnetic direction with the second upper magnetic pinned layer 122. Meanwhile, "11" is programmed to the magnetic random access memory 100.

Figure 2D:
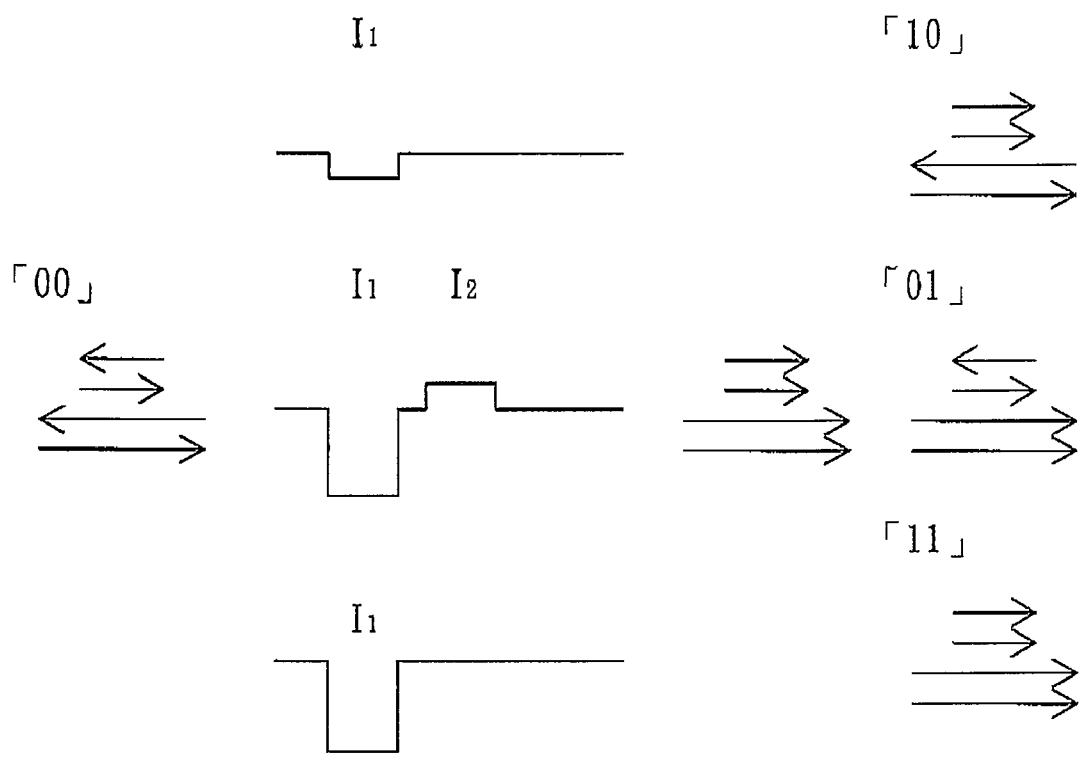
FIG. 2D is a perspective showing the magnetic random access memory according to the first embodiment of the invention programs "10", "01" or "11" from "00"

Referring to FIG. 2D, a perspective showing the magnetic random access memory 100 according to the first embodiment of the invention programs "10", "01" or "11" from "00" is shown. When the magnetic random access memory 100 is "00", the magnetic direction of the first magnetic free layer 114 is different from that of the first lower magnetic pinned layer 116, and the magnetic direction of the second magnetic free layer 124 is different from that of the second lower magnetic pinned layer 126, as indicated in the left-hand side of FIG. 2D.

When the magnetic random access memory 100 programs "10" from "00", a first current $I_1$ flowing through a first magnetic tunnel junction structure MTJ11 and a second magnetic tunnel junction structure MTJ12 is provided.

Wherein, $|I_{AP}(MTJ12)|<|I_1|<|I_{AP}(MTJ11)|$, the absolute value of the first current $I_1$ ranges between the absolute value of the first magnetic critical value $I_{AP}(MTJ11)$ and the absolute value of the second magnetic critical value $I_{AP}(MTJ12)$, the first current $I_1$ is large enough to turn over the second magnetic free layer 124 but still not large enough to turn over the first magnetic free layer 114.

Furthermore $I_1<0$, the first current $I_1$ flows to the first magnetic tunnel junction structure MTJ11 from the second magnetic tunnel junction structure MTJ12, such that the second magnetic free layer 124 is magnetized to have the same magnetic direction with the second lower magnetic pinned layer 126. Meanwhile, "10" is programmed to the magnetic random access memory 100.

When the magnetic random access memory 100 programs "01" from "00", a first current $I_1$ and a second current $I_2$ flowing through the first magnetic tunnel junction structure MTJ11 and the second magnetic tunnel junction structure MTJ12 are sequentially provided.

Wherein, $|I_{AP}(MTJ11)|<|I_1|$, the absolute value of the first current $I_1$ is larger than the absolute value of the first magnetic critical value $I_{AP}(MTJ11)$, the first current $I_1$ is large enough to turn over the first magnetic free layer 114 and the second magnetic free layer 124.

Furthermore, $I_1<0$, the first current $I_1$ flows to the first magnetic tunnel junction structure MTJ11 from the second magnetic tunnel junction structure MTJ12, such that the first magnetic free layer 114 is magnetized to have the same magnetic direction with the first lower magnetic pinned layer 116, and the second magnetic free layer 124 is magnetized to have the same magnetic direction with the second lower magnetic pinned layer 126.

Next, $|I_{AP}(MTJ12)|<|I_2|<|I_{AP}(MTJ11)|$, the absolute value of the second current $I_2$ ranges between the absolute value of the first magnetic critical value $I_{AP}(MTJ11)$ and the absolute value of the second magnetic critical value $I_{AP}(MTJ12)$, the second current $I_2$ is large enough to turn over the second magnetic free layer 124 but still not large enough to turn over the first magnetic free layer 114.

Furthermore, $I_2>0$, the second current $I_2$ flows to the second magnetic tunnel junction structure MTJ12 from the first magnetic tunnel junction structure MTJ11, such that the second magnetic free layer 124 is magnetized to have the same magnetic direction with the second upper magnetic pinned layer 122. Meanwhile, "01" is programmed to the magnetic random access memory 100.

When the magnetic random access memory 100 programs "11" from "00", a first current $I_1$ flowing through the first magnetic tunnel junction structure MTJ11 and the second magnetic tunnel junction structure MTJ12 is provided.

Wherein, $|I_{AP}(MTJ11)|<|I_1|$, the absolute value of the first current $I_1$ is larger than the absolute of the first magnetic critical value $I_{AP}(MTJ11)$, the first current $I_1$ is large enough to turn over the first magnetic free layer 114 and the second magnetic free layer 124.

Furthermore, $I_1<0$, the first current $I_1$ flows to the first magnetic tunnel junction structure MTJ11 from the second magnetic tunnel junction structure MTJ12, such that the first magnetic free layer 114 is magnetized to have the same magnetic direction with the first lower magnetic pinned layer 116 and the second magnetic free layer 124 is magnetized to have the same magnetic direction with the second lower magnetic pinned layer 126. Meanwhile, "11" is programmed to the magnetic random access memory 100.

Whatever data originally stored in the magnetic random access memory 100 may be programmed as a 2-bit data of "00", "01", "10" and "11" according the programming method of the invention.

The manufacturing method of the present embodiment of the invention the magnetic random access memory 100 is disclosed below with accompanied flowcharts.

Figure 3:
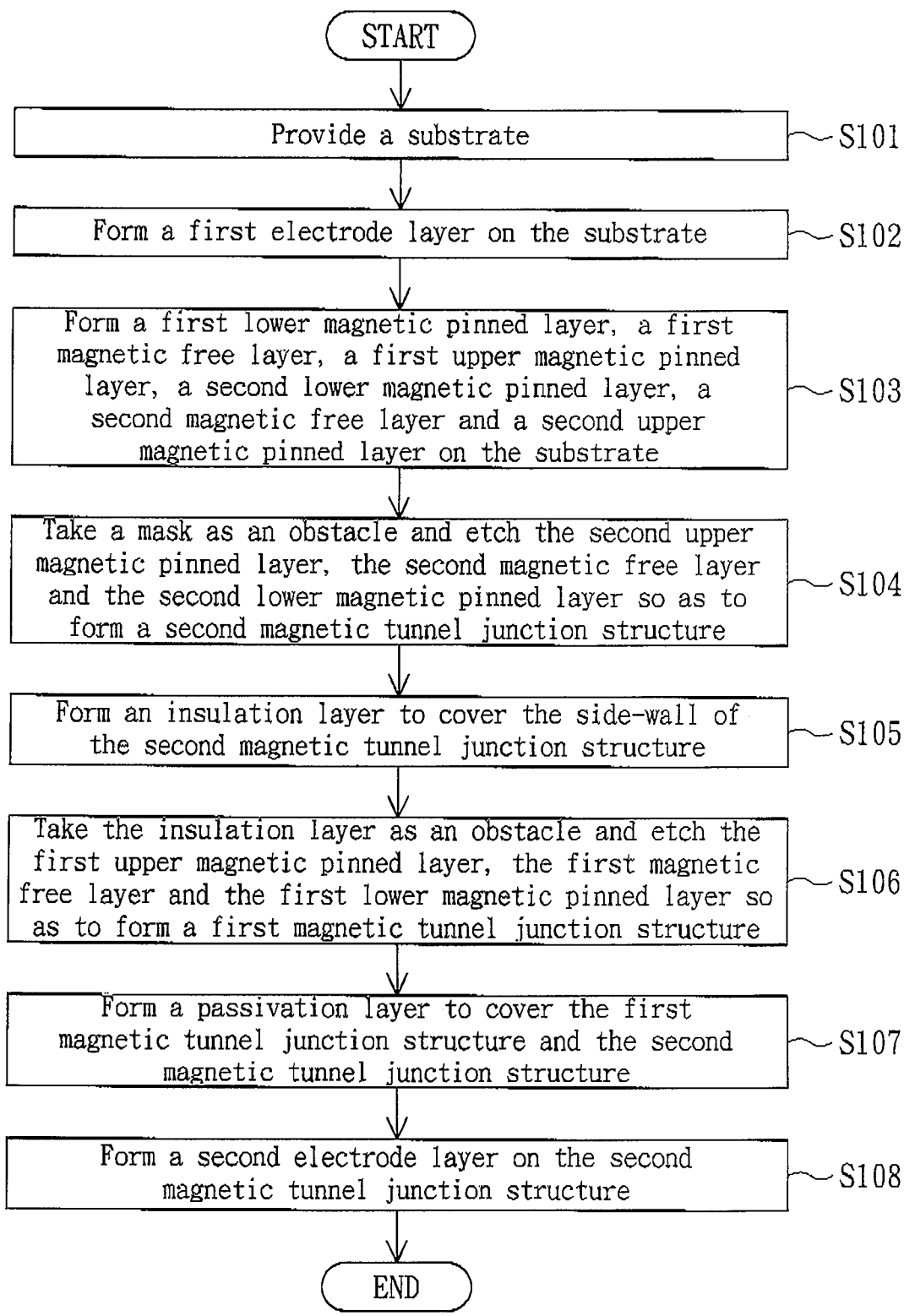
FIG. 3 is a flowchart for a manufacturing method of the magnetic random access memory according to the first embodiment of the invention.

Referring to FIG. 3 and FIGS. 4A~4I. FIG. 3 is a flowchart for a manufacturing method of a magnetic random access memory 100 according to the first embodiment of the invention. FIGS. 4A~4I are structural diagrams for each step of FIG. 3. Despite the present embodiment of the invention is exemplified by the steps illustrated in FIG. 3 and the structural diagram illustrated in FIG. 4A~4I, however the manufacturing method of a magnetic random access memory of the invention is not limited thereto.

Figure 4A:
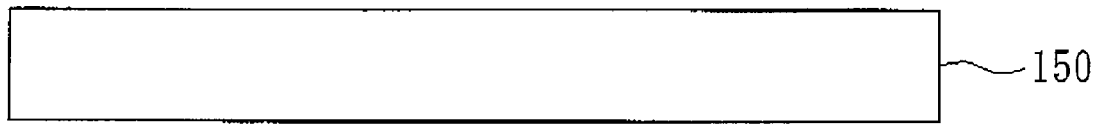
FIGS. 4A~4I are structural diagrams for each step of FIG. 3.

Firstly, as indicated in FIG. 4A, the method begins at the step S101 of FIG. 3, a substrate 150 is provided.

Figure 4B:
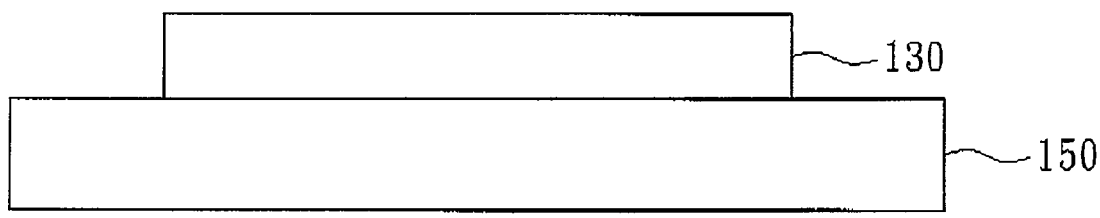

Next, as indicated in FIG. 4B, the method proceeds to the step S102 of FIG. 3, a first electrode layer 130 is formed on the substrate 150.

Figure 4C:
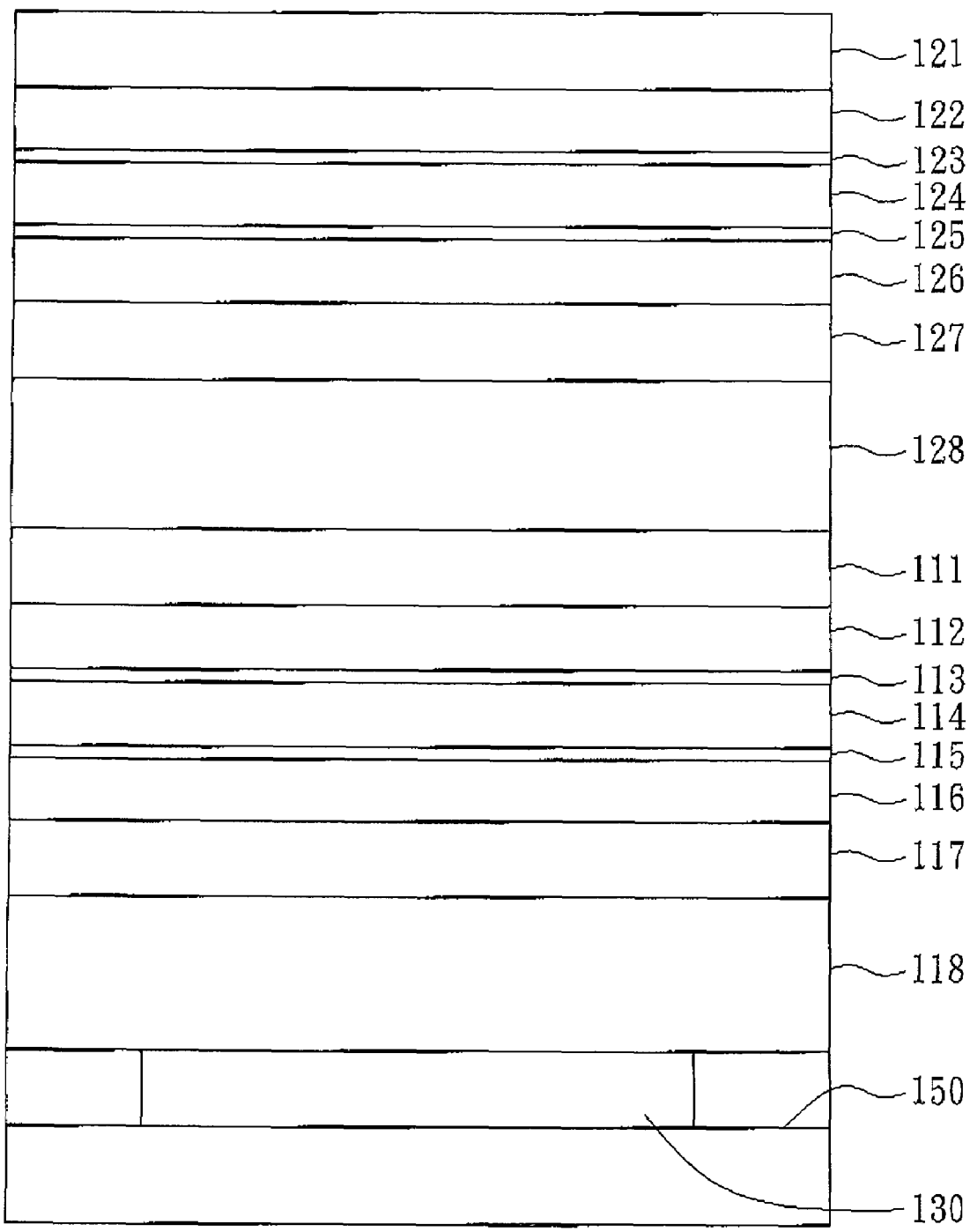

Then, as indicated in FIG. 4C, the method proceeds to the step S103 of FIG. 3, a first lower electrode layer 118, a first anti-ferromagnetic layer 117, a first lower magnetic pinned layer 116, a first spacer layer 115, a first magnetic free layer 114, a first barrier layer 113, a first upper magnetic pinned layer 112, a first upper electrode layer 111, a second lower electrode 128, a second anti-ferromagnetic layer 127, a second lower magnetic pinned layer 126, a second spacer layer 125, a second magnetic free layer 124, a second barrier layer 123, a second upper magnetic pinned layer 122 and a second upper electrode layer 121 are formed on the substrate 150.

In the present embodiment of the invention, the thickness and material for the structure each layer is not limited to a particular thickness and material. For example, the material of the first upper electrode layer 111, the first lower electrode layer 118, the second upper electrode layer 121 and the second lower electrode layer 128 is an electrical conductive material with low thermal conductivity such as metal-nitride, metal-oxynitride and conductive ceramic. The metal-nitride includes TiN and TaN. The metal-oxynitride includes TiON and TaON. The conductive ceramic includes $LaNiO_3$ (LNO) and $LaSrMnO_3$ (LSMO).

The material of the first anti-ferromagnetic layer 117 and the second anti-ferromagnetic layer 127 is an anti-ferromagnetic material such as FeMn or PtMn. The thickness of the first anti-ferromagnetic layer 117 and the second anti-ferromagnetic layer 127 is 10~200 nm.

The material of the first lower magnetic pinned layer 116 and the second lower magnetic pinned layer 126 is single ferromagnetic material, multiple ferromagnetic material or synthetic ferromagnetic structure (SAF). The single ferromagnetic material includes CoFe, NiFe, CoPt and CoFeB. The multiple ferromagnetic material includes CoFe/NiFe and NiFe/CoFeB. The synthetic ferromagnetic structure includes CoFeB/Ru/CoFe.

The material of the first spacer layer 115 and the second spacer layer 125 is $Al_2O_3$ or MgO. The thickness of the first spacer layer and the second spacer layer is 0.7~3.0 nm.

The material of the first magnetic free layer 114 and the second magnetic free layer 124 is single ferromagnetic material or multiple ferromagnetic material. The single ferromagnetic material includes CoFe, NiFe, CoPt and CoFeB. The multiple ferromagnetic material includes CoFe/NiFe and NiFe/CoFeB. The thickness of the first magnetic free layer 114 and the second magnetic free layer 124 is 1~20 nm.

The structure of each layer can be formed according to a thin-film forming method such as chemical vapor deposition (CVD) or physical vapor deposition (PVD). In the present embodiment of the invention, the structures of the above layers are formed according to the method of physical vapor deposition.

Figure 4D:
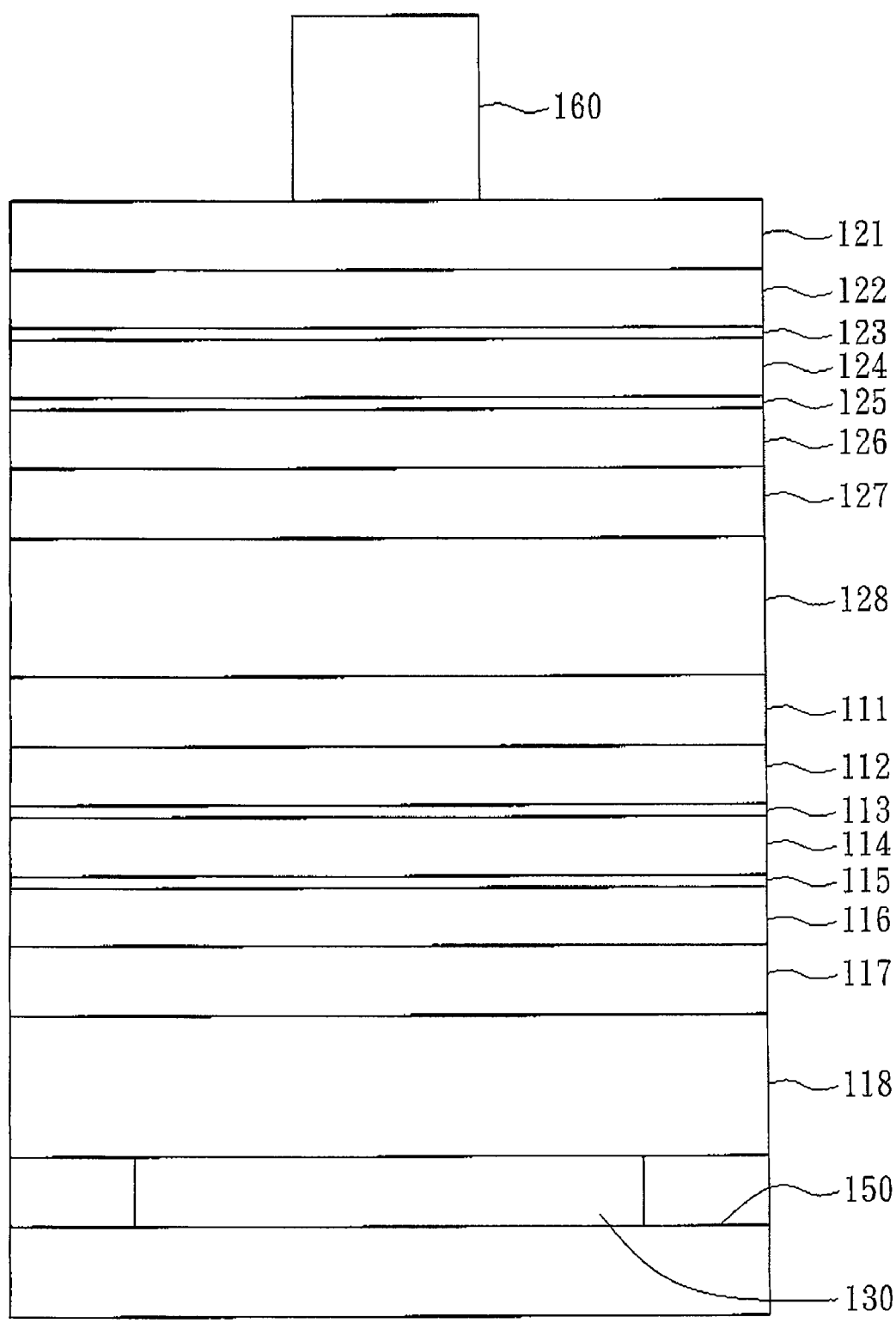

Next, as indicated in FIG. 4D, a mask 160 is formed. Examples of the mask 160 include cured photo-resist, silicon nitride or silicon oxide. In the present step, the width of the mask 160 is the width of the to-be-formed second magnetic tunnel junction structure MTJ12.

Figure 4E:
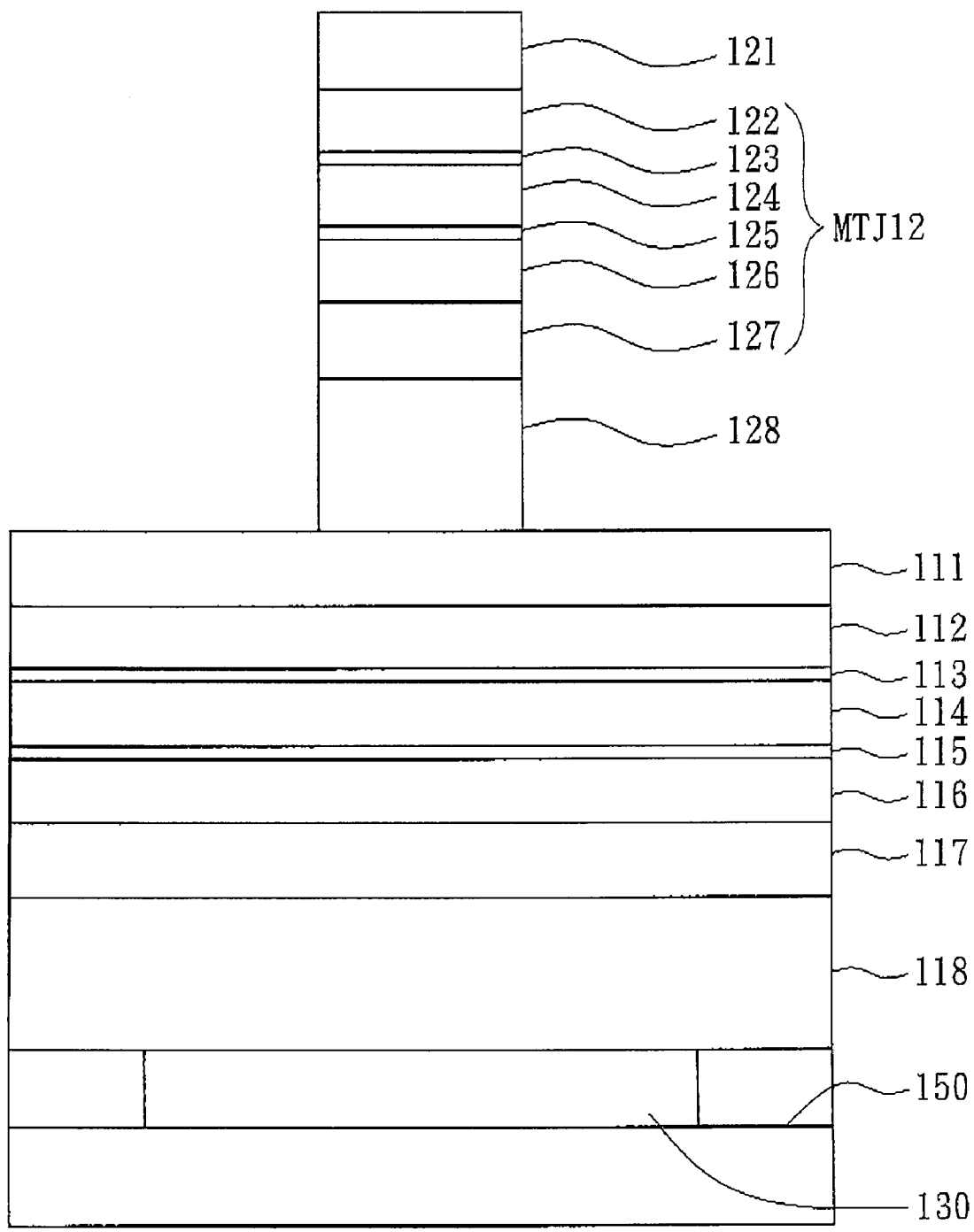

Afterwards, as indicated in FIG. 4E, the method proceeds to the step S104 of FIG. 3, the mask 160 is taken as an obstacle, the second upper electrode layer 121, the second upper magnetic pinned layer 122, the second barrier layer 123, the second magnetic free layer 124, the second spacer layer 125, the second lower magnetic pinned layer 126, the second anti-ferromagnetic layer 127 and the second lower electrode layer 128 are etched, and the mask 160 is removed so as to form a second magnetic tunnel junction structure MTJ12. In the present step, the etching method can be wet etching or dry etching. Preferably, the present embodiment of the invention adopts dry etching such as plasma etching to avoid lateral etching.

Figure 4F:
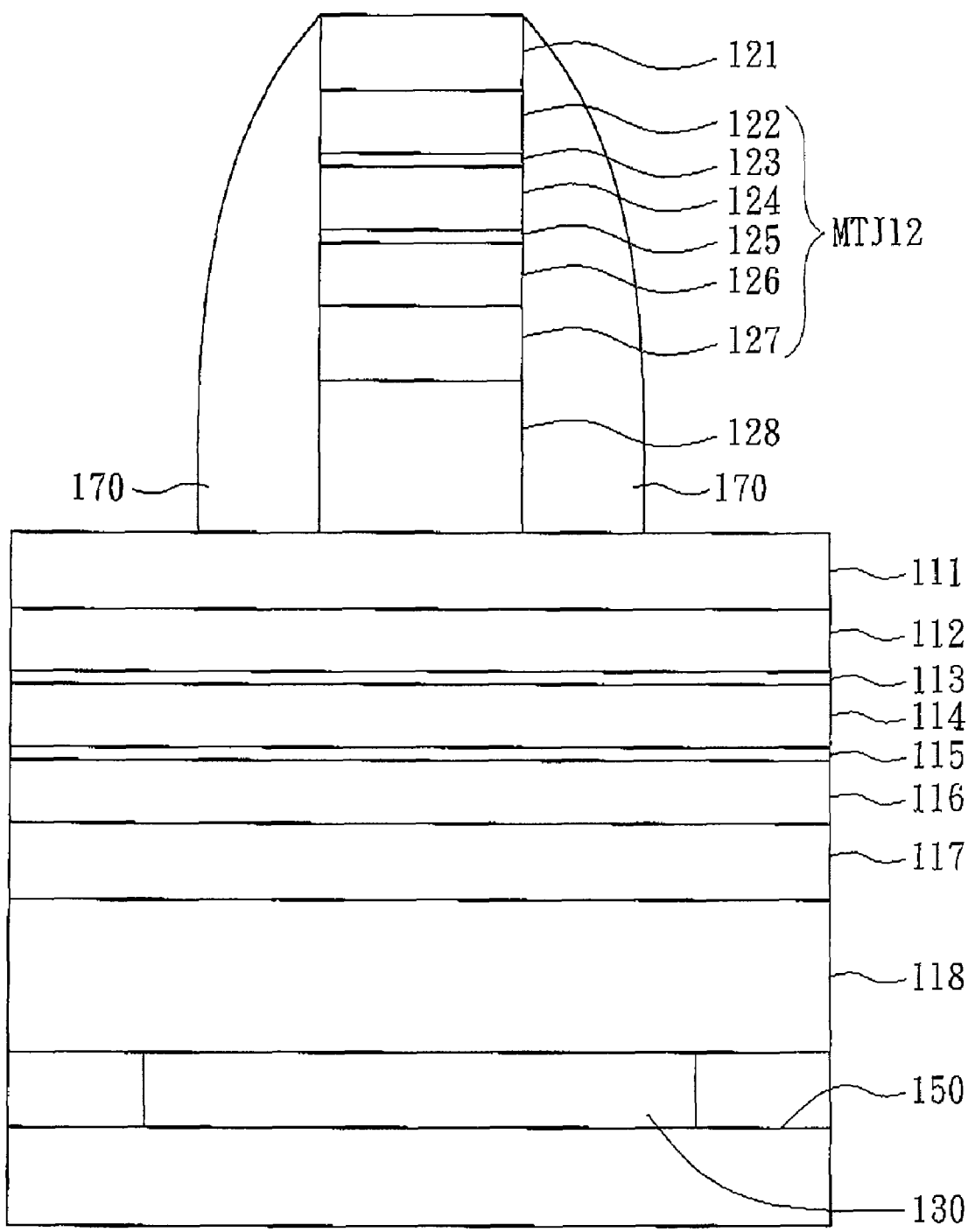

Next, as indicated in FIG. 4F, the method proceeds to the step S105 of FIG. 3, an insulator layer 170 covering the side-walls of the second magnetic tunnel junction structure MTJ12 is formed. In the present step, the width of the insulation layer 170 is equal to the width of the to-be-formed first magnetic tunnel junction structure MTJ11.

Figure 4G:
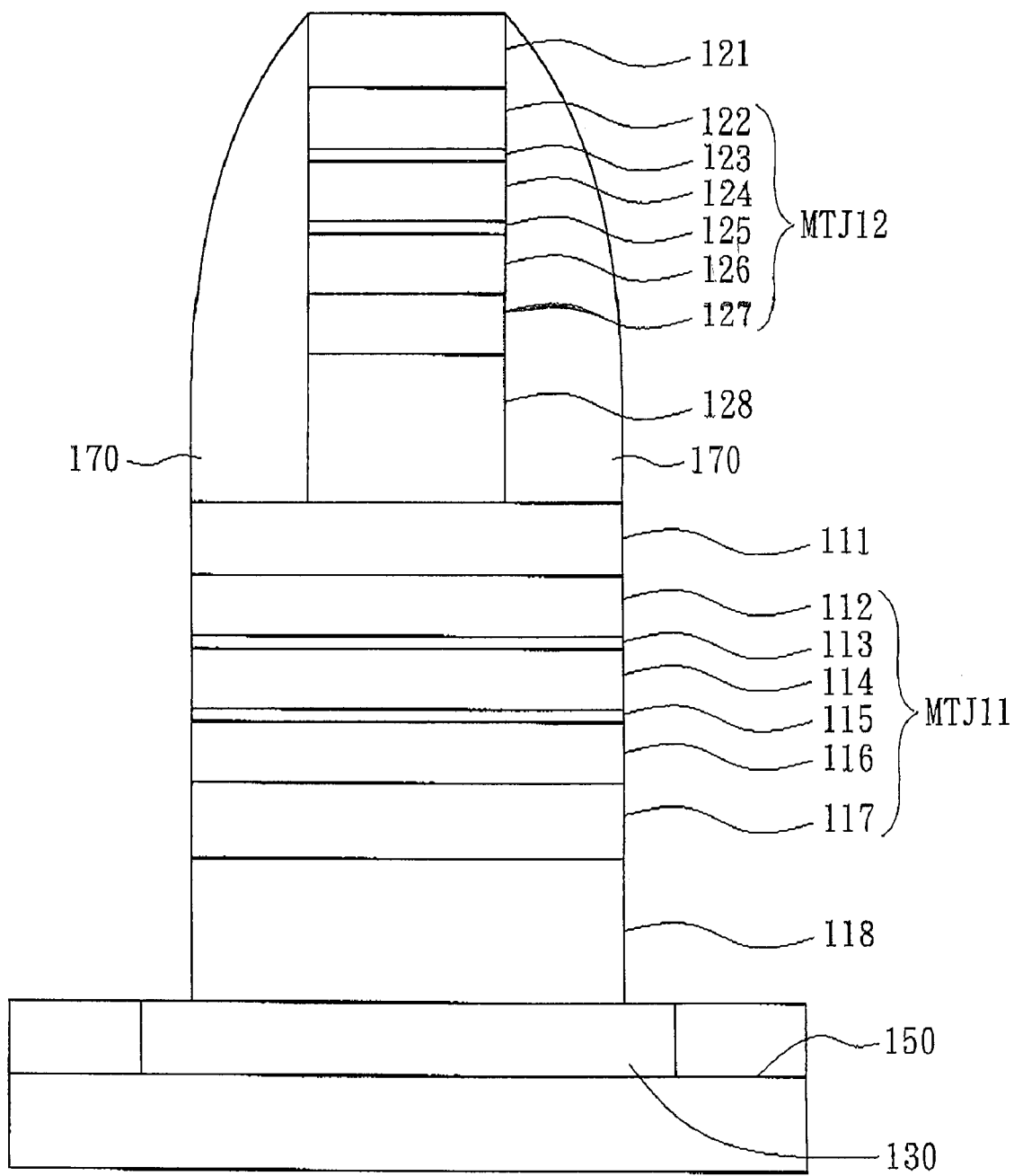

Then, as indicated in FIG. 4G, the method proceeds to the step S106 of FIG. 3, the insulation layer 170 is taken as an obstacle, the first upper electrode layer 111, the first upper magnetic pinned layer 112, the first barrier layer 113, the first magnetic free layer 114, the first spacer layer 115, the first lower magnetic pinned layer 116, the first anti-ferromagnetic layer 117 and the first lower electrode layer 118 are etched so as to form a first magnetic tunnel junction structure MTJ11. In the present step, the etching method can be wet etching or dry etching. Preferably, the present embodiment of the invention adopts dry etching such as plasma etching to avoid lateral etching.

Figure 4H:
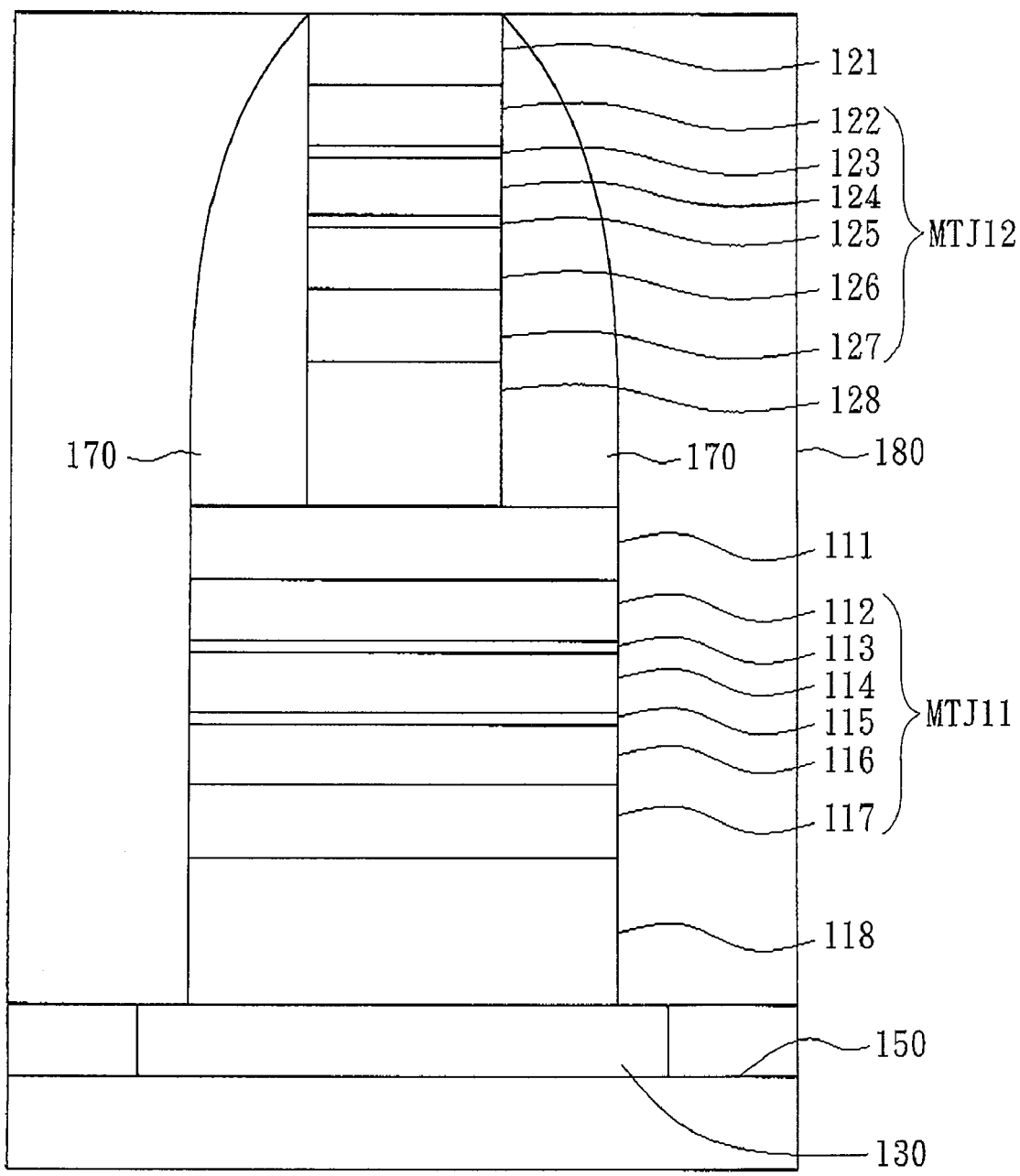

Next, as indicated in FIG. 4H, the method proceeds to the step S107 of FIG. 3, a passivation layer 180 covering the first magnetic tunnel junction structure MTJ11 and the second magnetic tunnel junction structure MTJ12 is formed. The formation of the passivation layer 180 can be completed according to plasma enhanced chemical vapor deposition (PECVD) or high-density-plasma chemical vapor deposition (HDP CVD). The passivation layer 180 is made from silicon oxide or low dielectric (low-K) material.

Figure 4I:
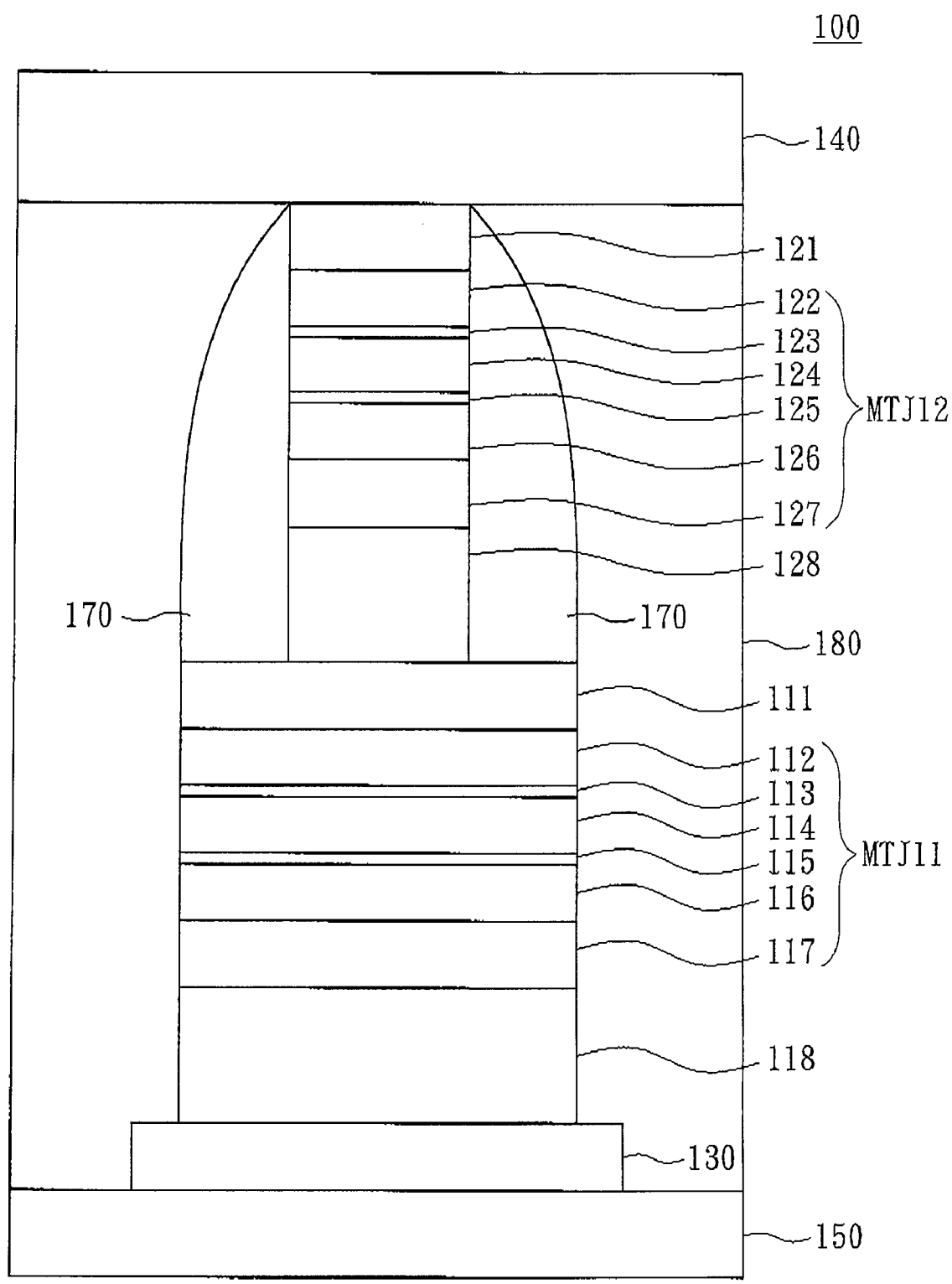

Then, as indicated in FIG. 4I, the method proceeds to the step S108 of FIG. 3, a second electrode layer 140 is formed on the second magnetic tunnel junction structure MTJ12. Until now, the magnetic random access memory 100 of the present embodiment of the invention is formed.

Second Embodiment

Figure 5:
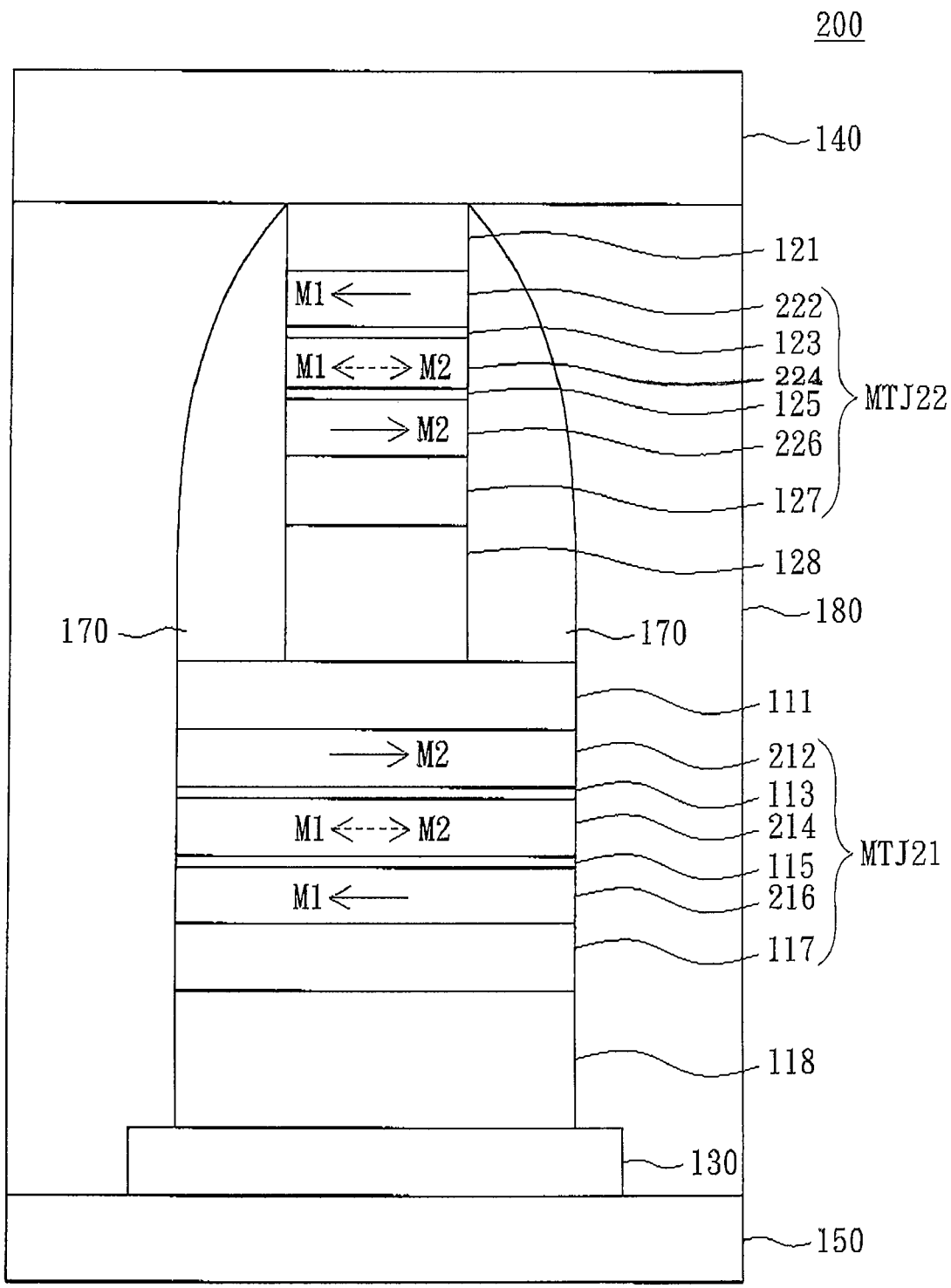
FIG. 5 a perspective of a magnetic random access memory according to a second embodiment of the invention.

The magnetic random access memory 200 of the present embodiment of the invention differs with the magnetic random access memory 100 of the first embodiment in the disposition of the magnetic directions of the second upper magnetic pinned layer 222 and the second lower magnetic pinned layer 226, and the other similarities are not repeated here. Referring to FIG. 5, a perspective of a magnetic random access memory 200 according to a second embodiment of the invention is shown. In the present embodiment of the invention, the first upper magnetic pinned layer 212 is pinned at the second magnetic direction M2, the first lower magnetic pinned layer 216 is pinned at the first magnetic direction M1, and the first magnetic free layer 214 may be magnetized to have the same magnetic direction with the first magnetic direction M1 or the second magnetic direction M2. The second upper magnetic pinned layer 222 is pinned at the first magnetic direction M1, the second lower magnetic pinned layer 226 is pinned at the second magnetic direction M2, and the second magnetic free layer 224 may be magnetized to have the same magnetic direction with the first magnetic direction M1 or the second magnetic direction M2.

Figure 6A:
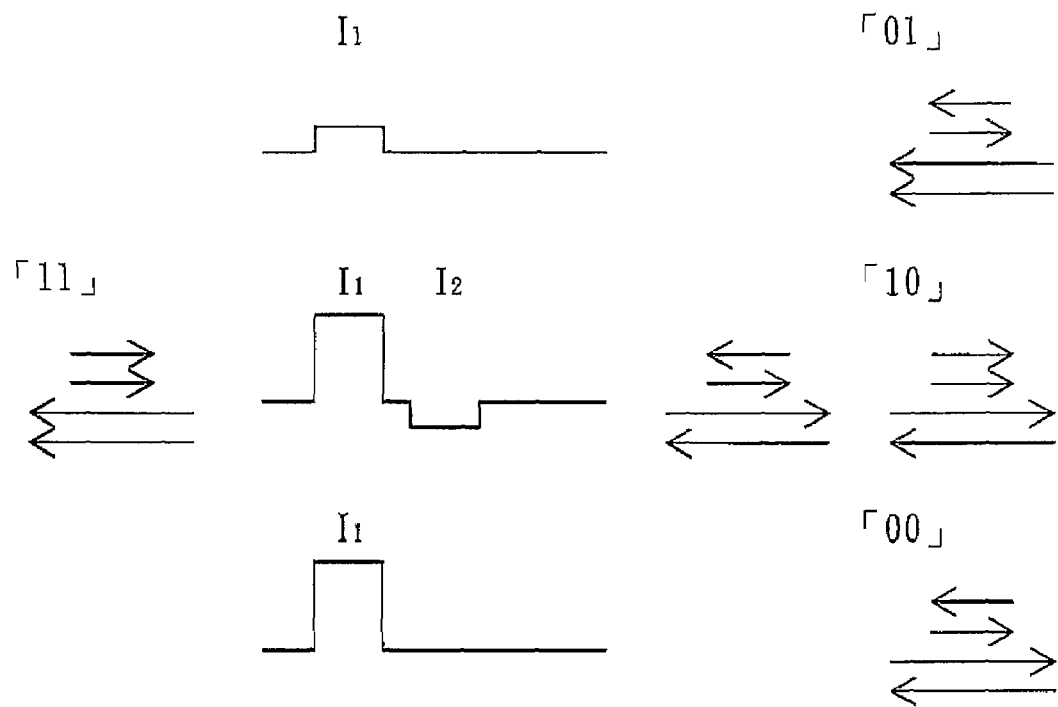
FIG. 6A is a perspective showing the magnetic random access memory according to the second embodiment of the invention programs "01", "10" or "00" from "11"

Referring to FIG. 6A, a perspective showing the magnetic random access memory 200 according to the second embodiment of the invention programs "01", "10" or "00" from "11" is shown. When the magnetic random access memory 200 is in "11" state, the magnetic direction of the first magnetic free layer 214 is the same with that of the first lower magnetic pinned layer 216, and the magnetic direction of the second magnetic free layer 224 is the same with that of the second lower magnetic pinned layer 226, as indicated in the left-hand side of FIG. 6A.

When the magnetic random access memory 200 programs "01" from "11", a first current $I_1$ flowing through the first magnetic tunnel junction structure MTJ21 and the second magnetic tunnel junction structure MTJ22 is provided.

Wherein, the value and direction of the first current $I_1$ are the same with the value and direction of the first current $I_1$ in the first row of FIG. 2A, and are not repeated here. The first current $I_1$ is large enough to turn over the second magnetic free layer 224 but still not large enough to turn over the first magnetic free layer 214, such that the second magnetic free layer 224 is magnetized to have the same magnetic direction with the second upper magnetic pinned layer 222. Meanwhile, "01" is programmed to the magnetic random access memory 200.

When the magnetic random access memory 200 programs "10" from "11", the first current $I_1$ and the second current $I_2$ flowing through the first magnetic tunnel junction structure MTJ21 and the second magnetic tunnel junction structure MTJ22 are sequentially provided.

Wherein, the value and direction of the first current $I_1$ are the same with that of the first current $I_1$ in the second row of FIG. 2A, and are not repeated here. The first current $I_1$ is large enough to turn over the first magnetic free layer 214 and the second magnetic free layer 224, such that the first magnetic free layer 214 is magnetized to have the same magnetic direction with the first upper magnetic pinned layer 212 and the second magnetic free layer 224 is magnetized to have the same magnetic direction with the second upper magnetic pinned layer 222.

Next, the value and direction of the second current $I_2$ are the same with that of the second current $I_2$ in the second row of FIG. 2A, and are not repeated here. The second current $I_2$ is large enough to turn over the second magnetic free layer 224 but still not large enough to turn over the first magnetic free layer 214, such that the second magnetic free layer 224 is magnetized to have the same magnetic direction with the second lower magnetic pinned layer 226. Meanwhile, "10" is programmed to the magnetic random access memory 200.

When the magnetic random access memory 200 programs "00" from "11", the first current $I_1$ flowing through the first magnetic tunnel junction structure MTJ21 and the second magnetic tunnel junction structure MTJ22 is provided.

Wherein, the value and direction of the first current $I_1$ are the same with that of the first current $I_1$ in the third row of FIG. 2A, and are not repeated here. The first current $I_1$ is large enough to turn over the first magnetic free layer 214 and the second magnetic free layer 224, such that the first magnetic free layer 214 is magnetized to have the same magnetic direction with the first upper magnetic pinned layer 212, and the second magnetic free layer 224 is magnetized to have the same magnetic direction with the second upper magnetic pinned layer 222. Meanwhile, "00" is programmed to the magnetic random access memory 200.

Figure 6B:
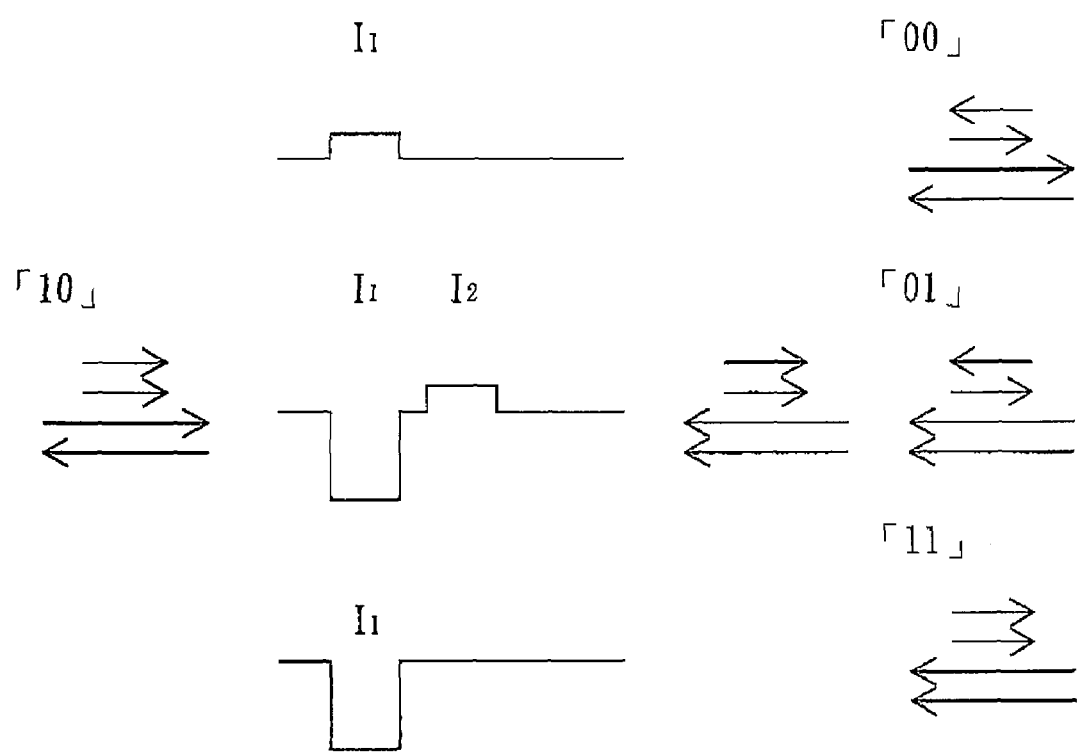
FIG. 6B is a perspective showing the magnetic random access memory according to the second embodiment of the invention programs "00", "01" or "11" from "10"

Referring to FIG. 6B, a perspective showing the magnetic random access memory 200 according to the second embodiment of the invention programs "00", "01" or "11" from "10". When the magnetic random access memory 200 is "10", the magnetic direction of the first magnetic free layer 214 is different from that of the first lower magnetic pinned layer 216, and the magnetic direction of the second magnetic free layer 224 is the same with that of the second lower magnetic pinned layer 226, as indicated in the left-hand side of FIG. 6B.

When the magnetic random access memory 200 programs "00" from "10", the first current $I_1$ flowing through the first magnetic tunnel junction structure MTJ21 and the second magnetic tunnel junction structure MTJ22 is provided.

Wherein, the value and direction of the first current $I_1$ are the same with that of the first current $I_1$ in the first row of FIG. 2B, and are not repeated here. The first current $I_1$ is large enough to turn over the second magnetic free layer 224 but still not large enough to turn over the first magnetic free layer 214, such that the second magnetic free layer 224 is magnetized to have the same magnetic direction with the second upper magnetic pinned layer 222.

When the magnetic random access memory 200 programs "01" from "10", the first current $I_1$ and a second current $I_2$ flowing through the first magnetic tunnel junction structure MTJ21 and the second magnetic tunnel junction structure MTJ22 are sequentially provided.

Wherein, the value and direction of the first current $I_1$ are the same with that of the first current $I_1$ in the second row of FIG. 2B, and are not repeated here. The first current $I_1$ is large enough to turn over the first magnetic free layer 214 and the second magnetic free layer 224, such that the first magnetic free layer 214 is magnetized to have the same magnetic direction with the first lower magnetic pinned layer 216 the magnetic direction of is the same with that of and the second magnetic free layer 224 is magnetized to have the same magnetic direction with the second lower magnetic pinned layer 226.

Next, the value and direction of the second current $I_2$ are the same with that of the second current $I_2$ in the second row of FIG. 2B, and are not repeated here. The second current $I_2$ is large enough to turn over the second magnetic free layer 224 but still not large enough to turn over the first magnetic free layer 214, such that the second magnetic free layer 224 is magnetized to have the same magnetic direction with the second upper magnetic pinned layer 222. Meanwhile, "01" is programmed to the magnetic random access memory 200.

When the magnetic random access memory 200 programs "11" from "10", the first current $I_1$ flowing through the first magnetic tunnel junction structure MTJ21 and the second magnetic tunnel junction structure MTJ22 is provided.

Wherein, the value and direction of the first current $I_1$ are the same with that of the first current $I_1$ in the third row of FIG. 2B and are not repeated here. The first current $I_1$ is large enough to turn over the first magnetic free layer 214 and the second magnetic free layer 224, such that the first magnetic free layer 214 is magnetized to have the same magnetic direction with the first lower magnetic pinned layer 216 and the second magnetic free layer 224 is magnetized to have the same magnetic direction with the second lower magnetic pinned layer 226. Meanwhile, "00" is programmed to the magnetic random access memory.

Figure 6C:
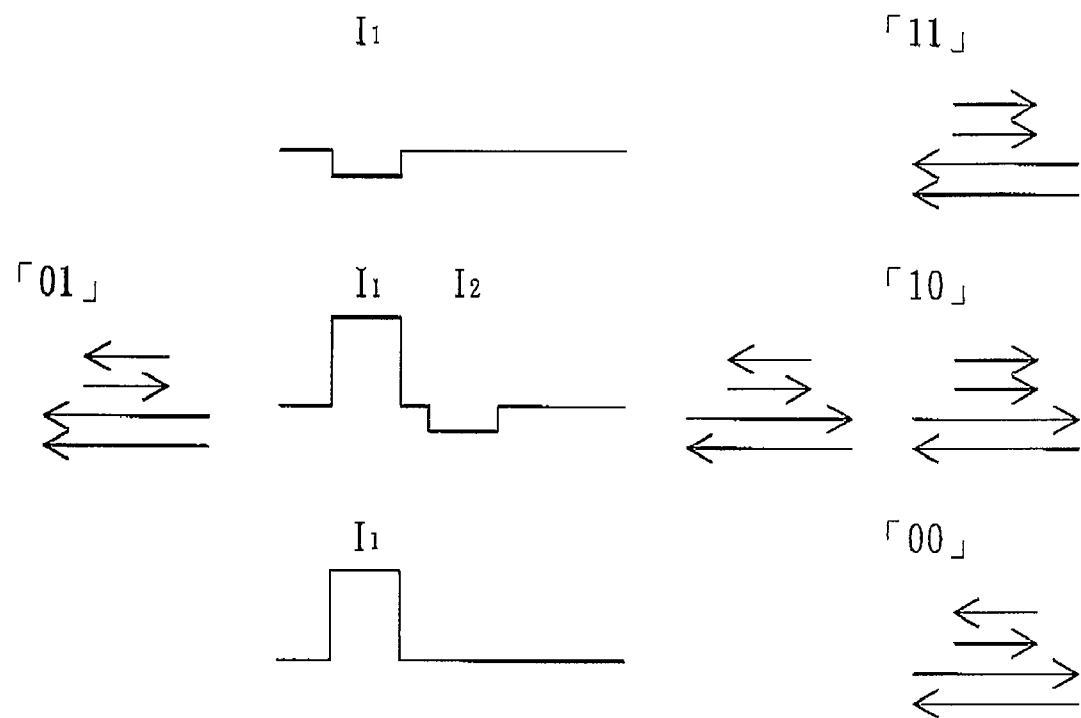
FIG. 6C is a perspective showing the magnetic random access memory according to the second embodiment of the invention programs "11", "10" or "00" from "01"

Referring to FIG. 6C, a perspective showing the magnetic random access memory 200 according to the second embodiment of the invention programs "11", "10" or "00" from "01" is shown. When the magnetic random access memory 200 is "01", the magnetic direction of the first magnetic free layer 214 is the same with that of the first lower magnetic pinned layer 216, and the magnetic direction of the second magnetic free layer 224 is different from that of the second lower magnetic pinned layer 226, as indicated in the left-hand side of FIG. 6C.

When the magnetic random access memory 200 programs "11" from "01", the first current $I_1$ flowing through the first magnetic tunnel junction structure MTJ21 and the second magnetic tunnel junction structure MTJ22 is provided.

Wherein, the value and direction of the first current $I_1$ are the same with that of the first current $I_1$ in the first row of FIG. 2C, and are not repeated here. The first current $I_1$ is large enough to turn over the second magnetic free layer 224 but still not large enough to turn over the first magnetic free layer 214, such that the second magnetic free layer 224 is magnetized to have the same magnetic direction with the second lower magnetic pinned layer 226. Meanwhile, "11" is programmed to the magnetic random access memory 200.

When the magnetic random access memory 200 programs "10" from "01", the first current $I_1$ and the second current $I_2$ flowing through the first magnetic tunnel junction structure MTJ21 and the second magnetic tunnel junction structure MTJ22 are sequentially provided.

Wherein, the value and direction of the first current $I_1$ are the same with that of the first current $I_1$ in the second row of FIG. 2C, and are not repeated here. The first current $I_1$ is large enough to turn over the first magnetic free layer 214 and the second magnetic free layer 224, such that the first magnetic free layer 214 is magnetized to have the same magnetic direction with the first upper magnetic pinned layer 212 and the second magnetic free layer 224 is magnetized to have the same magnetic direction with the second upper magnetic pinned layer 222.

Next, the value and direction of the second current $I_1$ are the same with that of the second current $I_2$ in the second row of FIG. 2C, and are not repeated here. The second current $I_2$ is large enough to turn over the second magnetic free layer 224 but still not large enough to turn over the first magnetic free layer 214, such that the second magnetic free layer 224 is magnetized to have the same magnetic direction with the second lower magnetic pinned layer 226. Meanwhile, "10" is programmed to the magnetic random access memory 200.

When the magnetic random access memory 200 programs "00" from "01", the first current $I_1$ flowing through the first magnetic tunnel junction structure MTJ21 and the second magnetic tunnel junction structure MTJ22 is provided.

Wherein, the value and direction of the first current $I_1$ are the same with that of the first current $I_1$ in the third row of FIG. 2C, and are not repeated here. The first current $I_1$ is large enough to turn over the first magnetic free layer 214 and the second magnetic free layer 224, such that the first magnetic free layer 214 is magnetized to have the same magnetic direction with the first upper magnetic pinned layer 212 and the second magnetic free layer 224 is magnetized to have the same magnetic direction with the second upper magnetic pinned layer 222. Meanwhile, "11" is programmed to the magnetic random access memory 200.

Figure 6D:
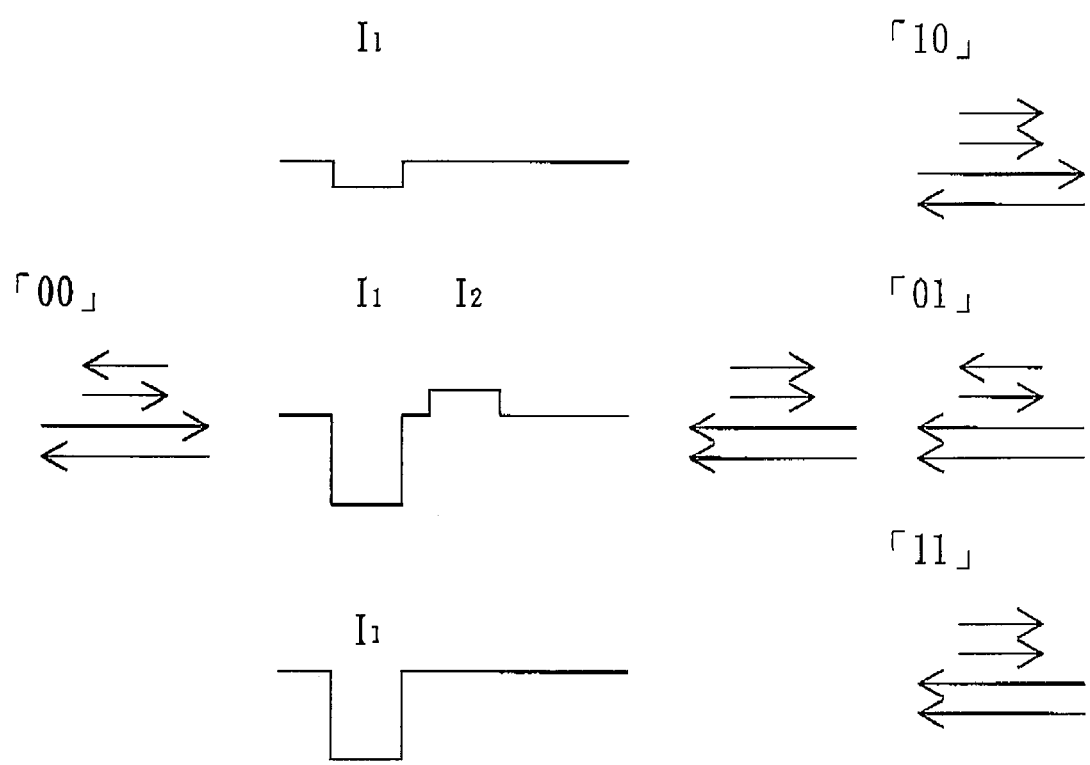
FIG. 6D is a perspective showing the magnetic random access memory according to the second embodiment of the invention programs "10", "01" or "11" from "00"

Referring to FIG. 6D, a perspective showing the magnetic random access memory 200 according to the second embodiment of the invention programs "10", "01" or "11" from "00" is shown. When the magnetic random access memory 200 is "00", the magnetic direction of the first magnetic free layer 214 is different from that of the first lower magnetic pinned layer 216, and the magnetic direction of the second magnetic free layer 224 is different from that of the second lower magnetic pinned layer 226, as indicated in the left-hand side of FIG. 6D.

When the magnetic random access memory 200 programs "10" from "00", the first current $I_1$ flowing through the first magnetic tunnel junction structure MTJ21 and the second magnetic tunnel junction structure MTJ22 is provided.

Wherein, the value and direction of the first current $I_1$ are the same with that of the first current $I_1$ in the first row of FIG. 2D, and are not repeated here. The first current $I_1$ is large enough to turn over the second magnetic free layer 224 but still not large enough to turn over the first magnetic free layer 214, such that the second magnetic free layer 224 is magnetized to have the same magnetic direction with the second lower magnetic pinned layer 226. Meanwhile, "10" is programmed to the magnetic random access memory 200.

When the magnetic random access memory 200 programs "01" from "00", the first current $I_1$ and the second current $I_2$ flowing through the first magnetic tunnel junction structure MTJ21 and the second magnetic tunnel junction structure MTJ22 are sequentially provided.

Wherein, the value and direction of the first current $I_1$ are the same with that of the first current $I_1$ in the second row of FIG. 2D, and are not repeated here. The first current $I_1$ is large enough to turn over the first magnetic free layer 214 and the second magnetic free layer 224, such that the first magnetic free layer 214 is magnetized to have the same magnetic direction with the first lower magnetic pinned layer 216 and the second magnetic free layer 224 is magnetized to have the same magnetic direction with the second lower magnetic pinned layer 226.

Next, the value and direction of the second current $I_2$ are the same with that of the second current $I_2$ in the second row of FIG. 2C, and are not repeated here. The second current $I_2$ is large enough to turn over the second magnetic free layer 224 but still not large enough to turn over the first magnetic free layer 214, such that the second magnetic free layer 224 is magnetized to have the same magnetic direction with the second upper magnetic pinned layer 222. Meanwhile, "01" is programmed to the magnetic random access memory 200.

When the magnetic random access memory 200 programs "11" from "00", the first current $I_1$ flowing through the first magnetic tunnel junction structure MTJ21 and the second magnetic tunnel junction structure MTJ22 is provided.

Wherein, the value and direction of the first current $I_1$ are the same with that of the first current $I_1$ in the third row of FIG. 2C, and are not repeated here. The first current $I_1$ is large enough to turn over the first magnetic free layer 214 and the second magnetic free layer 224, such that the first magnetic free layer 214 is magnetized to have the same magnetic direction with the first lower magnetic pinned layer 216 and the second magnetic free layer 224 is magnetized to have the same magnetic direction with the second lower magnetic pinned layer 226. Meanwhile, "11" is programmed to the magnetic random access memory 200.

Whatever data originally stored in the magnetic random access memory 200 may be programmed as a 2-bit data of "00", "01", "10" and "11" according the programming method of the invention.

Third Embodiment

Figure 7:
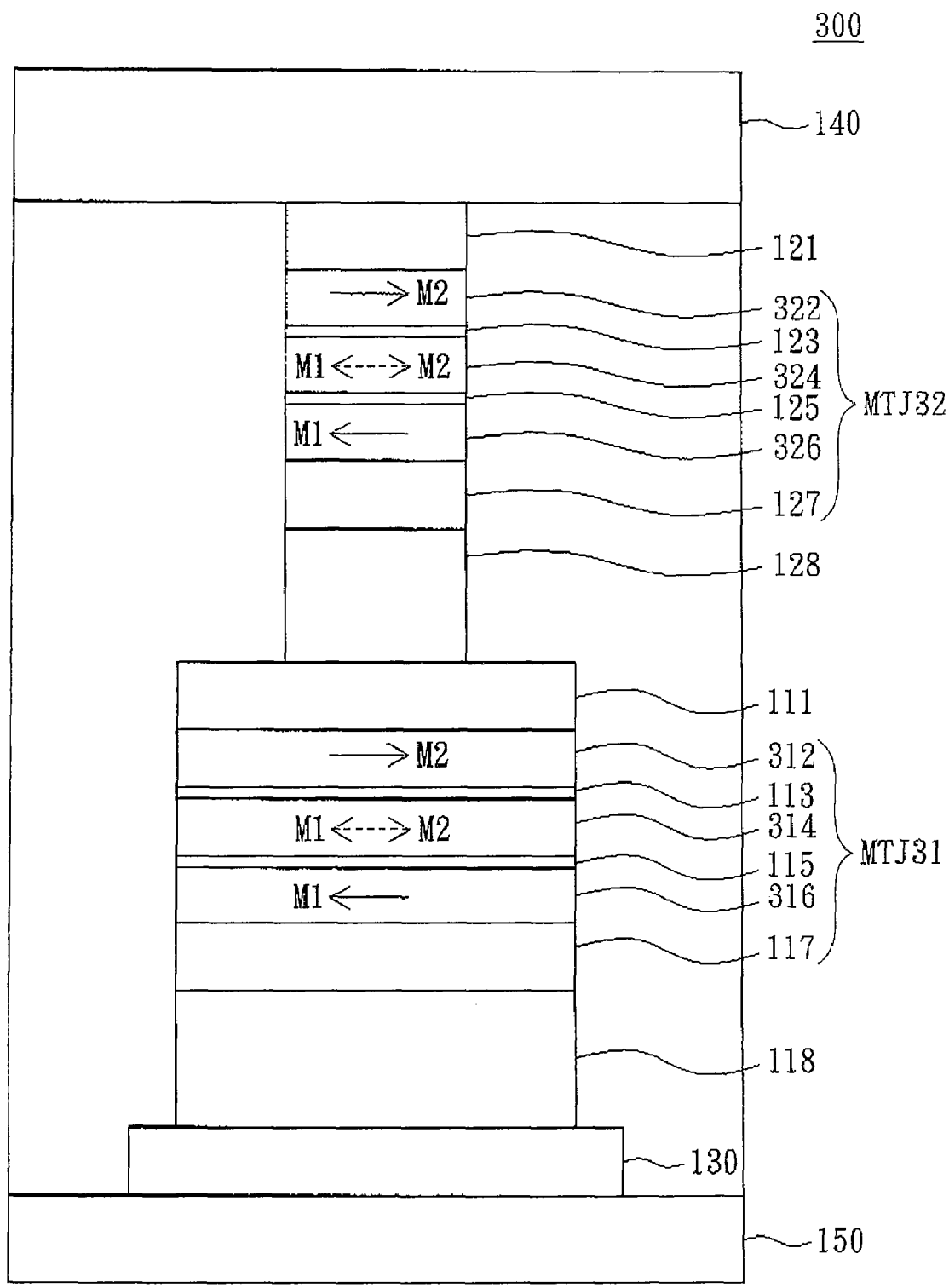
FIG. 7 is a perspective of a magnetic random access memory according to a third embodiment of the invention.
Figure 8A:
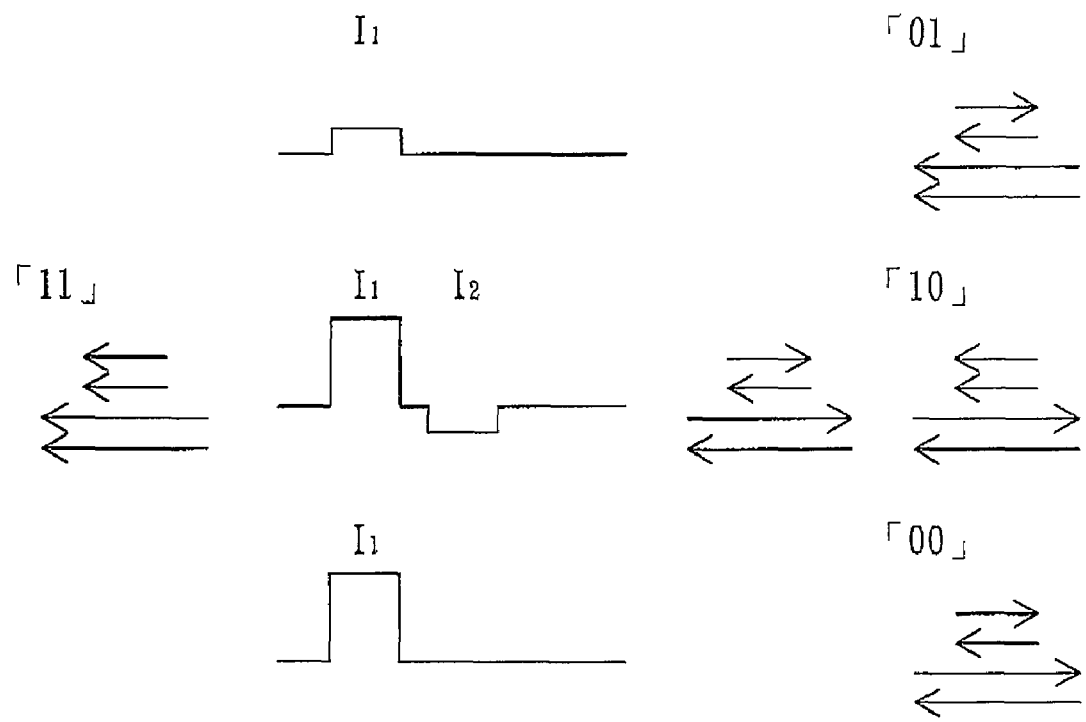
FIGS. 8A~8D are perspectives showing the magnetic random access memory according to the third embodiment of the invention programs data from "11", "10", "01" or "00"
Figure 8B:
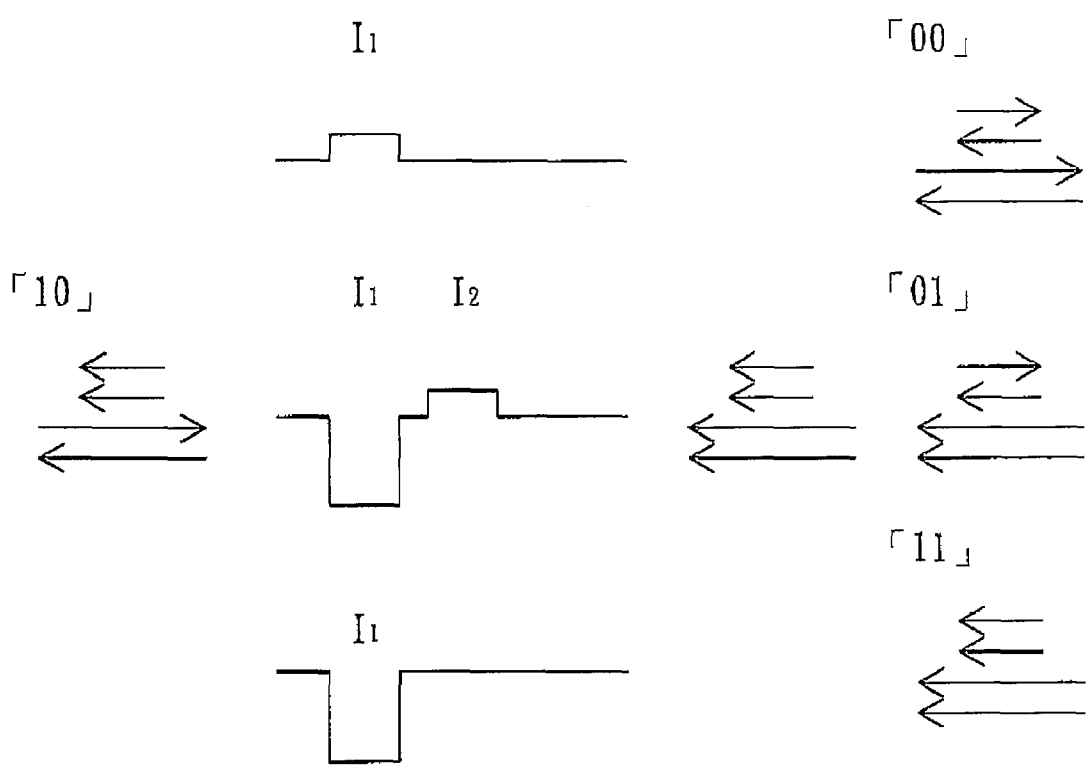
Figure 8C:
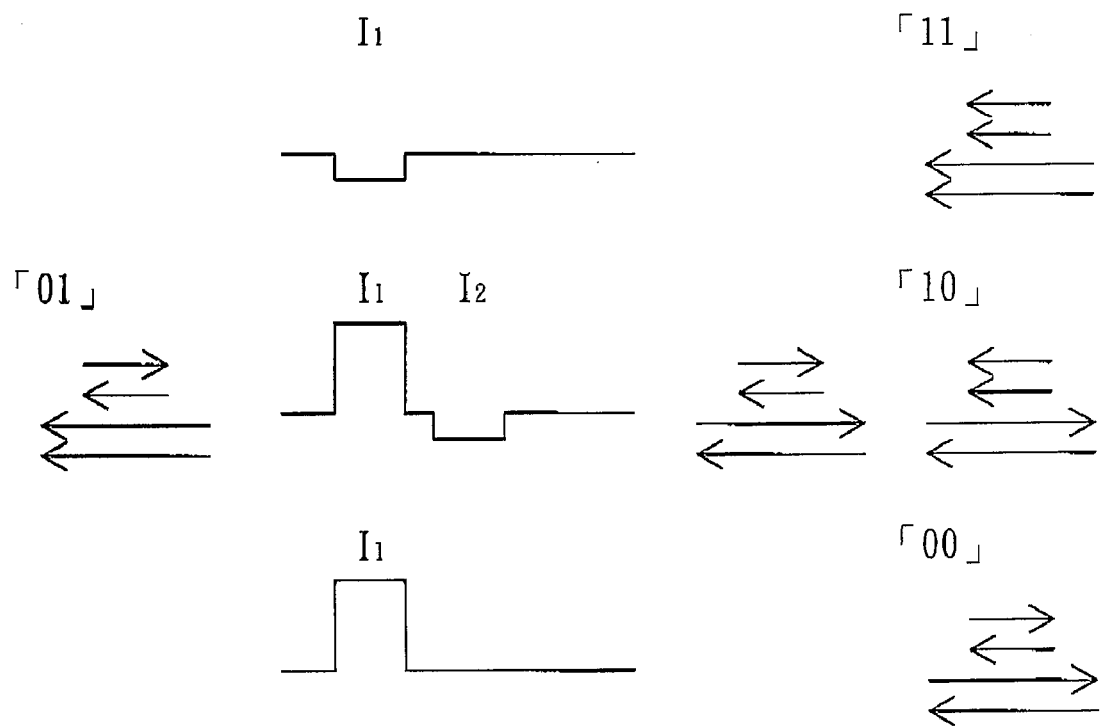
Figure 8D:
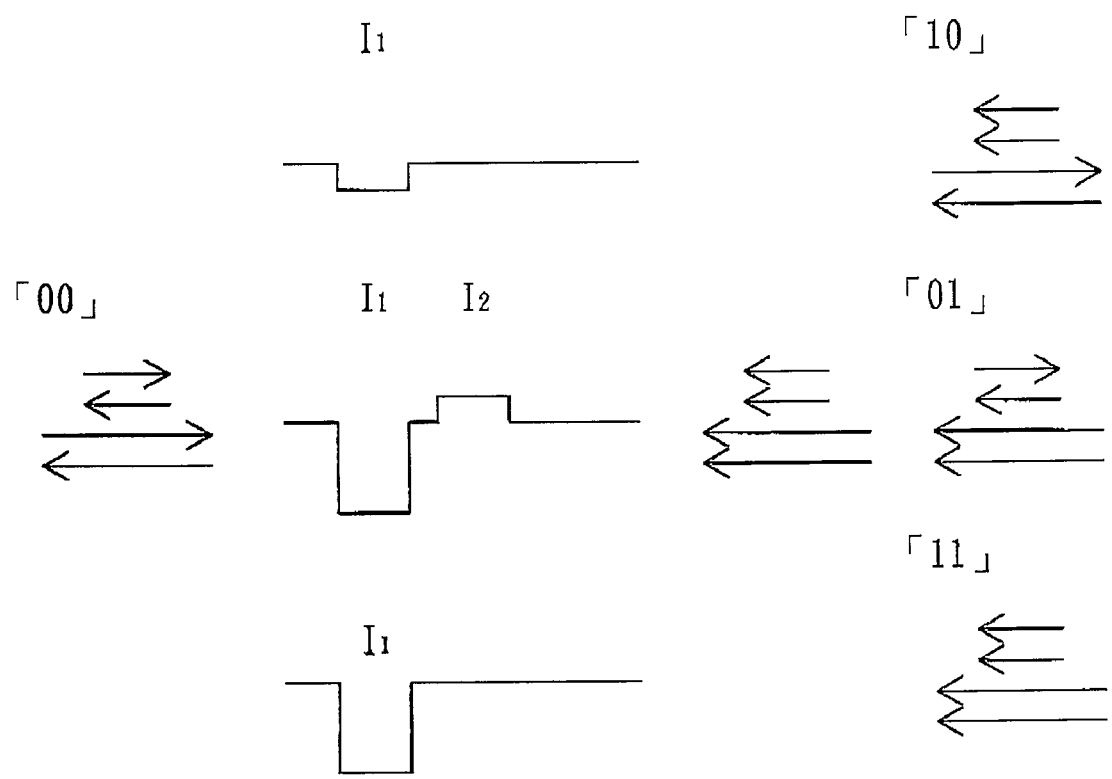

The magnetic random access memory 300 of the present embodiment of the invention differs with the magnetic random access memory 100 of the first embodiment in the disposition of the magnetic directions of the first upper magnetic pinned layer 312, the first lower magnetic pinned layer 316, the second upper magnetic pinned layer 322 and the second lower magnetic pinned layer 326, and other similarities are not repeated here. Referring to FIG. 7, a perspective of a magnetic random access memory 300 according to a third embodiment of the invention is shown. In the first magnetic tunnel junction structure MTJ31, the first upper magnetic pinned layer 312 is pinned at the second magnetic direction M2, the first lower magnetic pinned layer 316 is pinned at the first magnetic direction M1, and the first magnetic free layer 314 may be magnetized to have the same magnetic direction with the first magnetic direction M1 or the second magnetic direction M2. In the second magnetic tunnel junction structure MTJ32, the second upper magnetic pinned layer 322 is pinned at the second magnetic direction M2, the second lower magnetic pinned layer 326 is pinned at the first magnetic direction M1, and the second magnetic free layer 324 may be magnetized to have the same magnetic direction with the first magnetic direction M1 or the second magnetic direction M2.

Referring to FIGS. 8A~8D, perspectives showing the magnetic random access memory 300 according to the third embodiment of the invention programs data from "11", "10", "01" or "00" are shown. According to the programming method of the present embodiment of the invention, a first current $I_1$ or a second current $I_2$ is provided to change the first magnetic free layer 314 and the second magnetic free layer 324. The detailed programming processes disclosed in FIGS. 8A~8D are similar to that in the first embodiment, and are not repeated here.

Fourth Embodiment

Figure 9:
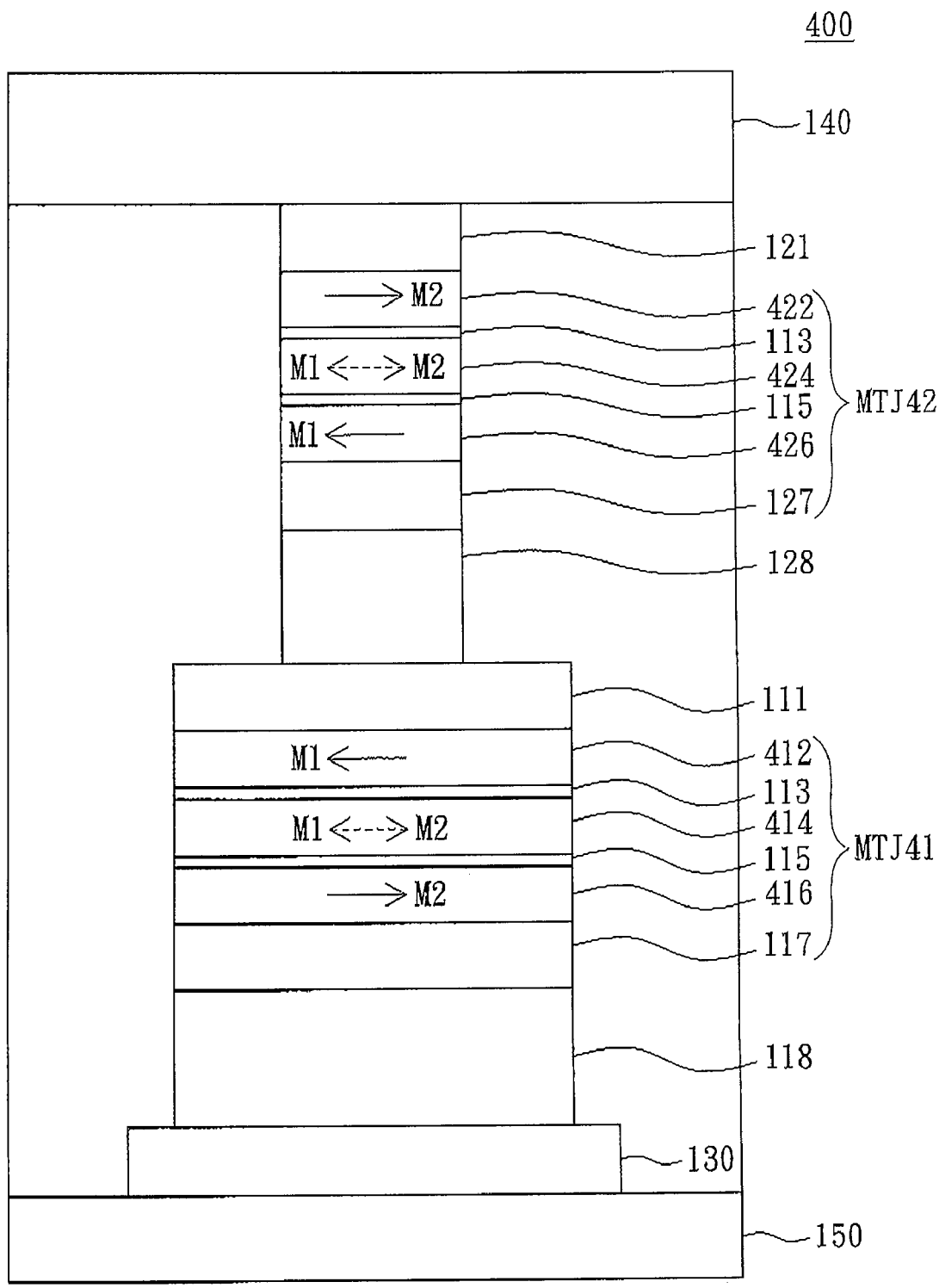
FIG. 9 is a perspective of a magnetic random access memory according to a fourth embodiment of the invention.
Figure 10A:
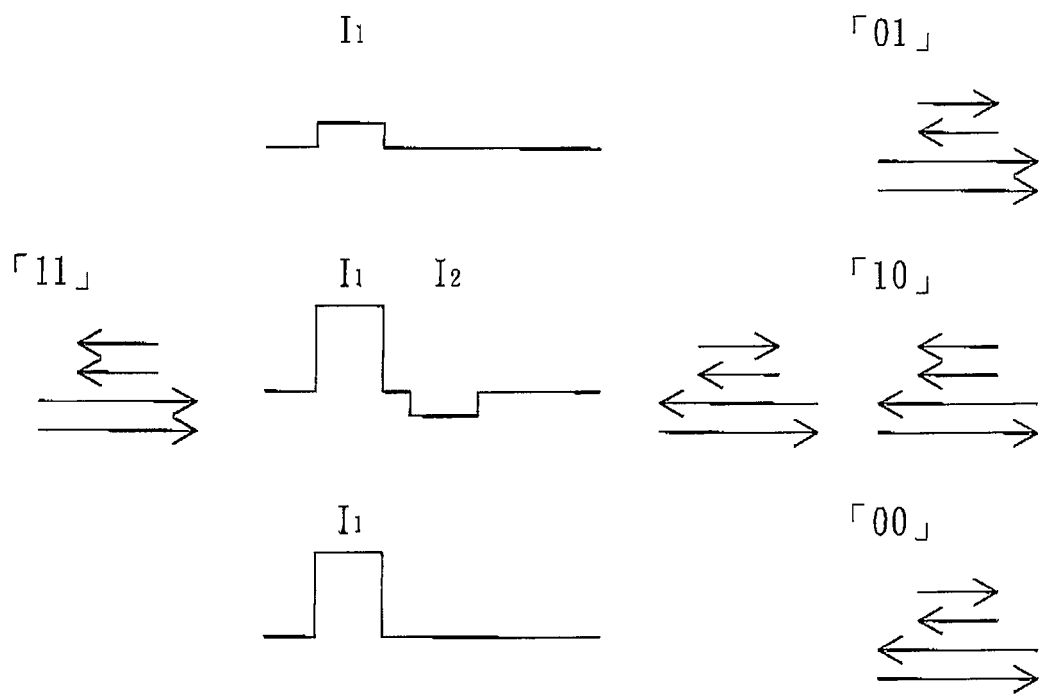
FIGS. 10A~10D are perspectives showing the magnetic random access memory according to the fourth embodiment of the invention programs data from "11", "10", "01" or "00".
Figure 10B:
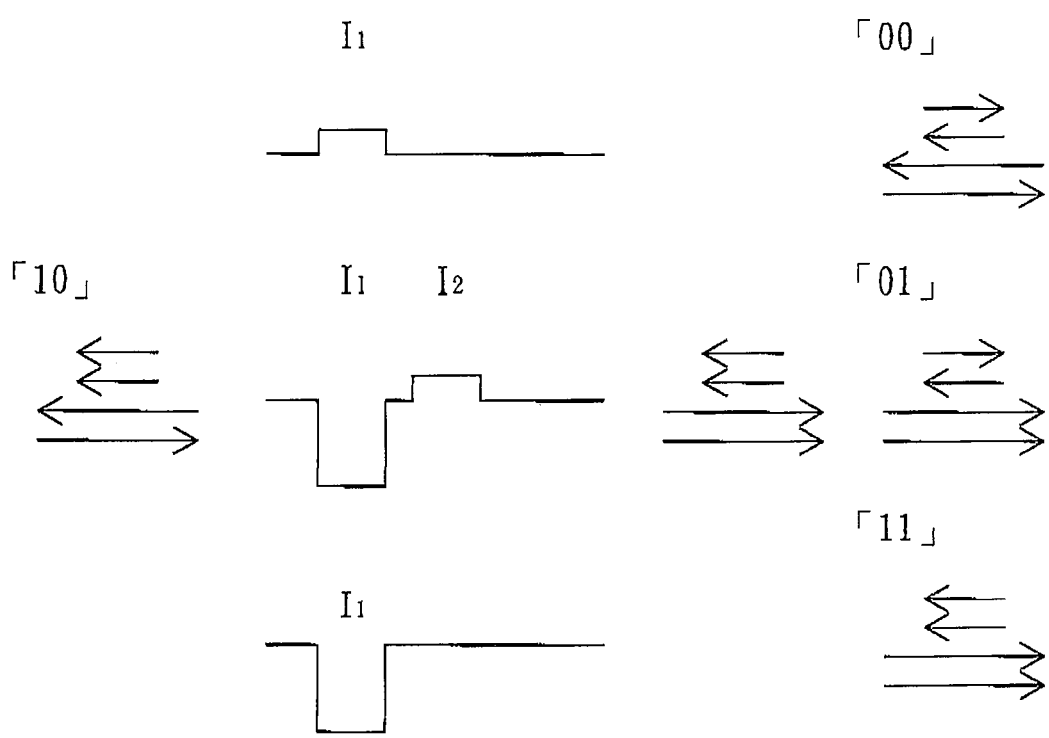
Figure 10C:
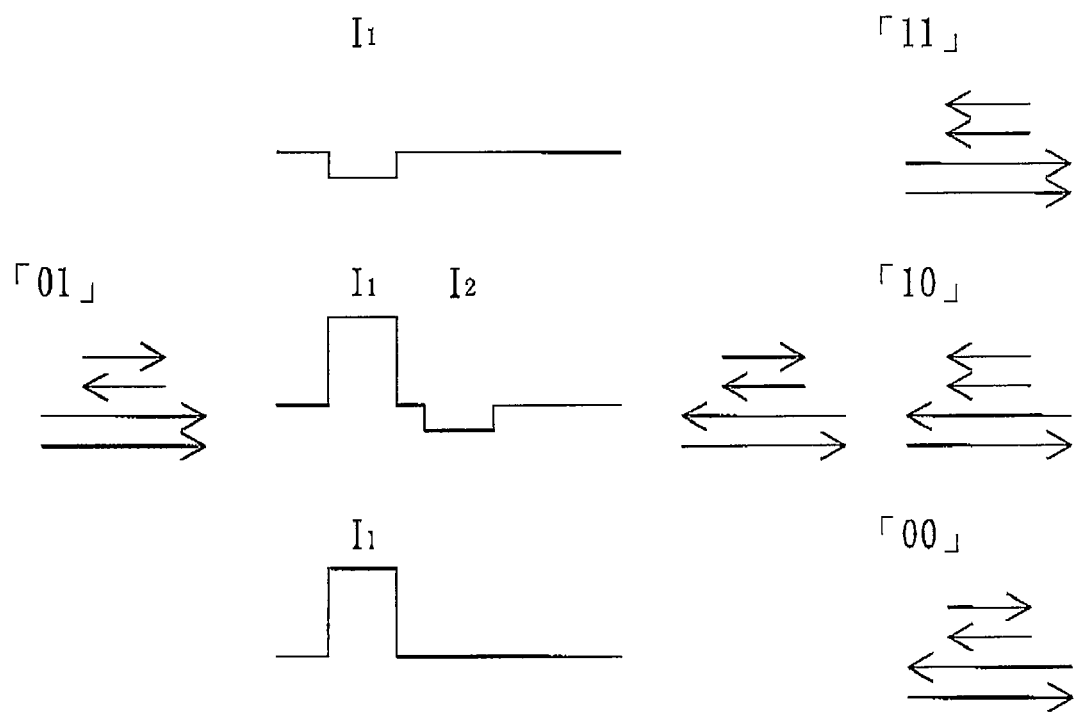
Figure 10D:
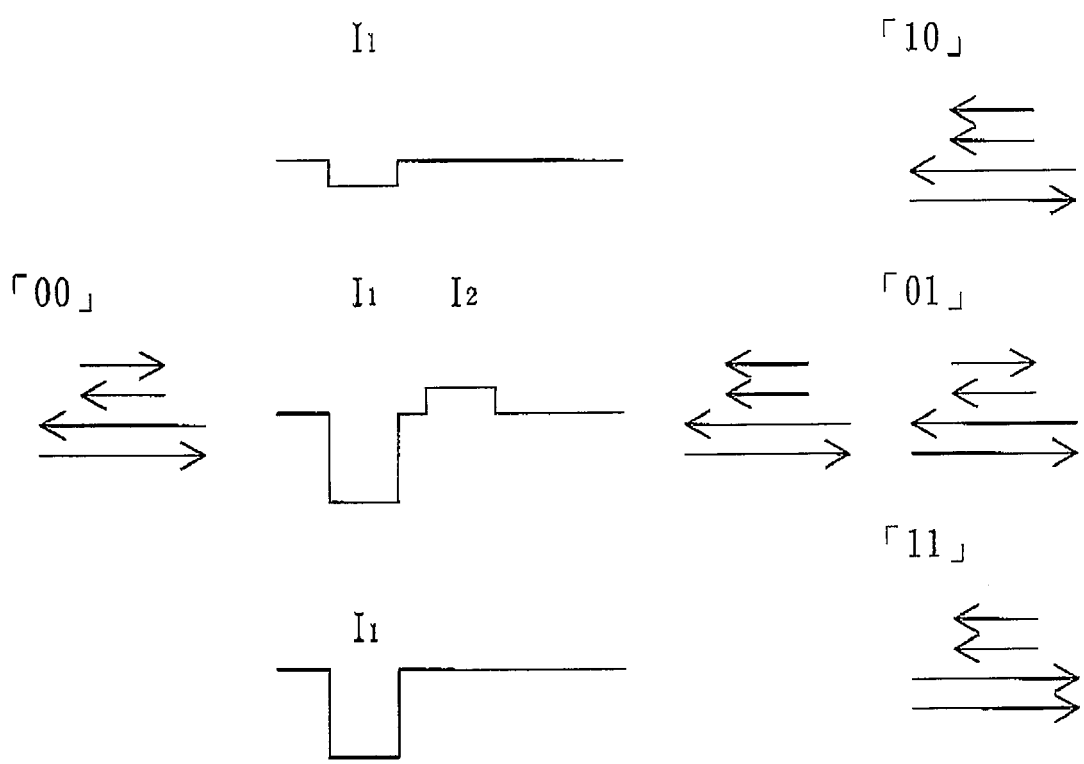

The magnetic random access memory 400 of the present embodiment of the invention differs with the magnetic random access memory 100 of the first embodiment in the disposition of the magnetic directions of the first upper magnetic pinned layer 412, the first lower magnetic pinned layer 416, the second upper magnetic pinned layer 422 and the second lower magnetic pinned layer 426, and other similarities not repeated here. Referring to FIG. 9, a perspective of a magnetic random access memory 400 according to a forth embodiment of the invention is shown. In the first magnetic tunnel junction structure MTJ41, the first upper magnetic pinned layer 412 is pinned at the first magnetic direction M1, the first lower magnetic pinned layer 416 is pinned at the second magnetic direction M2, and the first magnetic free layer 414 may be magnetized to have the same magnetic direction with the first magnetic direction M1 or the second magnetic direction M2. In the second magnetic tunnel junction structure MTJ42, the second upper magnetic pinned layer 422 is pinned at the second magnetic direction M2, the second lower magnetic pinned layer 426 is pinned at the first magnetic direction M1, and the second magnetic free layer 424 may be magnetized to have the same magnetic direction with the first magnetic direction M1 or the second magnetic direction M2.

Referring to FIGS. 10A~10D, are perspectives showing the magnetic random access memory 400 according to the fourth embodiment of the invention programs data from "11", "10", "01" or "00" are shown. According to the programming method of the present embodiment of the invention, a first current $I_1$ or a second current $I_2$ is provided to change the first magnetic free layer 414 and the second magnetic free layer 424. The detailed programming processes disclosed in FIGS. 10A~10D are similar to that in the first embodiment, and are not repeated here.

According to the magnetic random access memory and a manufacturing method and a programming method thereof disclosed in the above embodiments of the invention. By electrically connecting a first magnetic tunnel junction structure and a second magnetic tunnel junction structure whose volume is different the first magnetic tunnel junction structure and by controlling the value and direction of the first current and the second current, the first magnetic tunnel junction structure and the second magnetic tunnel junction structure create four data types, namely "11", "10", "01" and "00". Therefore, each magnetic random access memory has 2-bit data storage, not only decreasing the space required by the magnetic random access memory, but also increasing the programming speed of the magnetic random access memory.

While the invention has been described by way of example and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A magnetic random access memory (MRAM), comprising:
   a first magnetic tunnel junction (MTJ) structure; and
   a second magnetic tunnel junction structure electrically connected with the first magnetic tunnel junction structure, wherein the first magnetic tunnel junction structure and the second magnetic tunnel junction structure are used for storing data, the first magnetic tunnel junction structure has a first surface which is contiguous to the second magnetic tunnel junction structure, the second magnetic tunnel junction structure has a second surface which is contiguous to the first magnetic tunnel junction structure, the second surface is smaller than the first surface.

2. The magnetic random access memory according to claim 1, wherein
   the first magnetic tunnel junction structure comprises:
      a first upper magnetic pinned layer;
      a first magnetic free layer; and
      a first lower magnetic pinned layer whose magnetic direction is opposite to that of the first upper magnetic pinned layer; and
   the second magnetic tunnel junction structure comprises:
      a second upper magnetic pinned layer;
      a second magnetic free layer; and
      a second lower magnetic pinned layer whose magnetic direction is opposite to that of the second upper magnetic pinned layer.

3. The magnetic random access memory according to claim 2, wherein the first magnetic tunnel junction structure further comprises:
   a first upper electrode layer disposed near the first upper magnetic pinned layer; and
   a first lower electrode layer disposed near the first lower magnetic pinned layer, and the second magnetic tunnel junction structure further comprises:
   a second upper electrode layer disposed near the second upper magnetic pinned layer; and
   a second lower electrode layer disposed near the second lower magnetic pinned layer, wherein the material of the first upper electrode layer, the first lower electrode layer, the second upper electrode layer and the second lower electrode layer is an electrical conductive material with low thermal conductivity.

4. The magnetic random access memory according to claim 3, wherein the material of the first upper electrode layer, the first lower electrode layer, the second upper electrode layer and the second lower electrode layer is metal-nitride, metal-oxynitride and conductive ceramic.

5. The magnetic random access memory according to claim 3, wherein the material of the first upper electrode layer, the first lower electrode layer, the second upper electrode layer and the second lower electrode layer is TiN, TaN, TiON, TaON, $LaNiO_3$ (LNO) or $LaSrMnO_3$ (LSMO).

6. The magnetic random access memory according to claim 2, wherein the first magnetic tunnel junction structure further comprises:
   a first anti-ferromagnetic layer disposed near the first lower magnetic pinned layer; and the second magnetic tunnel junction structure further comprises:
   a second anti-ferromagnetic layer disposed near the second lower magnetic pinned layer, wherein the material of the first anti-ferromagnetic layer and the second anti-ferromagnetic layer is an anti-ferromagnetic material.

7. The magnetic random access memory according to claim 6, wherein the material of the first anti-ferromagnetic layer and the second anti-ferromagnetic layer is FeMn or PtMn.

8. The magnetic random access memory according to claim 6, wherein the thickness of the first anti-ferromagnetic layer and the second anti-ferromagnetic layer is 10~200 nm.

9. The magnetic random access memory according to claim 2, wherein the material of the first lower magnetic pinned layer and the second lower magnetic pinned layer is single ferromagnetic material, multiple ferromagnetic material or synthetic ferromagnetic structure (SAF).

10. The magnetic random access memory according to claim 9, wherein the material of the first lower magnetic pinned layer and the second lower magnetic pinned layer is CoFe, NiFe, CoPt, CoFeB, CoFe/NiFe, NiFe/CoFeB or CoFeB/Ru/CoFe.

11. The magnetic random access memory according to claim 2, wherein the first magnetic tunnel junction structure further comprises:
   a first spacer layer disposed between the first lower magnetic pinned layer and the first magnetic free layer; and
   the second magnetic tunnel junction structure further comprises:
   a second spacer layer disposed between the second lower magnetic pinned layer and the second magnetic free layer, wherein the material of the first spacer layer and the second spacer layer is $Al_2O_3$ or MgO.

12. The magnetic random access memory according to claim 11, wherein the thickness of the first spacer layer and the second spacer layer is 0.7~3.0 nm.

13. The magnetic random access memory according to claim 2, wherein the material of the first magnetic free layer and the second magnetic free layer is single ferromagnetic material or multiple ferromagnetic material.

14. The magnetic random access memory according to claim 13, wherein the material of the first spacer layer and the second spacer layer is CoFe, NiFe, CoPt, CoFeB, CoFe/NiFe or NiFe/CoFeB.

15. The magnetic random access memory according to claim 13, wherein the thickness of the first magnetic free layer and the second magnetic free layer is 1~20 nm.

16. The magnetic random access memory according to claim 2, wherein the first upper magnetic pinned layer, the first magnetic free layer and the first lower magnetic pinned layer substantially have the same width.

17. The magnetic random access memory according to claim 2, wherein the second upper magnetic pinned layer, the second magnetic free layer and the second lower magnetic pinned layer substantially have the same width.

18. The magnetic random access memory according to claim 2, wherein the first upper magnetic pinned layer is pinned at a first magnetic direction, the first lower magnetic pinned layer is pinned at a second magnetic direction, the first magnetic free layer may be magnetized to have the same magnetic direction with the first magnetic direction or the second magnetic direction.

19. The magnetic random access memory according to claim 2, wherein the second upper magnetic pinned layer is pinned at the first magnetic direction, the second lower magnetic pinned layer is pinned at the second magnetic direction, the second magnetic free layer may be magnetized to have the same magnetic direction with the first magnetic direction or the second magnetic direction.

20. The magnetic random access memory according to claim 1, wherein the volume of the second magnetic tunnel junction structure is substantially smaller than two thirds of the volume of the first magnetic tunnel junction structure.

21. The magnetic random access memory according to claim 1, further comprises:
- a first electrode layer electrically in-series connected with the first magnetic tunnel junction structure; and
- a second electrode layer electrically in-series connected with the second magnetic tunnel junction structure, wherein the first electrode layer and the second electrode layer provide a current flowing through the first magnetic tunnel junction structure and the second magnetic tunnel junction structure.

22. The magnetic random access memory according to claim 1, wherein the first magnetic tunnel junction structure is electrically connected with the second magnetic tunnel junction structure in series.

23. A manufacturing method of a magnetic random access memory, comprising:
- (a) providing a substrate;
- (c) forming a first lower magnetic pinned layer, a first magnetic free layer, a first upper magnetic pinned layer, a second lower magnetic pinned layer, a second magnetic free layer and a second upper magnetic pinned layer on the substrate;
- (d) taking a mask as an obstacle and etching the second upper magnetic pinned layer, the second magnetic free layer and the second lower magnetic pinned layer so as to form a second magnetic tunnel junction structure; and
- (f) etching the first upper magnetic pinned layer, the first magnetic free layer and the first lower magnetic pinned layer so as to form a first magnetic tunnel junction structure.

24. The manufacturing method of a magnetic random access memory according to claim 23, wherein before performing the step (f) the manufacturing method further comprising
- (e) forming an insulation layer to cover the side-wall of the second magnetic tunnel junction structure; and the step (f) takes the insulation layer as an obstacle for etching the first upper magnetic pinned layer, the first magnetic free layer and the first lower magnetic pinned layer.

25. The manufacturing method of a magnetic random access memory according to claim 23, further comprises:
- (g) forming a passivation layer to cover the first magnetic tunnel junction structure and the second magnetic tunnel junction structure.

26. The manufacturing method of a magnetic random access memory according to claim 25, wherein before the step (c), the manufacturing method further comprises:
- (b) forming a first electrode layer on the substrate; and following the step (g), the manufacturing method further comprises:
- (h) forming a second electrode layer on the second magnetic tunnel junction structure.

27. A programming method of a magnetic random access memory, comprising:
- (I) providing a first magnetic tunnel junction structure and a second magnetic tunnel junction structure, wherein the first magnetic tunnel junction structure and the second magnetic tunnel junction structure are used for storing data, the first magnetic tunnel junction structure has a first surface which is contiguous to the second magnetic tunnel junction structure, the second magnetic tunnel junction structure has a second surface which is contiguous to the first magnetic tunnel junction structure, the second surface is smaller than the first surface; and
- (II) providing a first current flowing through a first magnetic tunnel junction structure and a second magnetic tunnel junction structure.

28. The programming method of a magnetic random access memory according to claim 27, wherein the first magnetic tunnel junction structure has a first magnetic critical value, the second magnetic tunnel junction structure has a second magnetic critical value, in the step (II), the absolute value of the first current ranges between the first magnetic critical value and the second magnetic critical value, and the first current flows to the second magnetic tunnel junction structure from the first magnetic tunnel junction structure.

29. The programming method of a magnetic random access memory according to claim 27, wherein the first magnetic tunnel junction structure has a first magnetic critical value, the second magnetic tunnel junction structure has a second magnetic critical value, in the step (II), the absolute value of the first current ranges between the first magnetic critical value and the second magnetic critical value, and the first current flows to the first magnetic tunnel junction structure from the second magnetic tunnel junction structure.

30. The programming method of a magnetic random access memory according to claim 27, wherein the first magnetic tunnel junction structure has a first magnetic critical value, in the step (II), the absolute value of the first current is larger than the first magnetic critical value, and the first current flows to the second magnetic tunnel junction structure from the first magnetic tunnel junction structure.

31. The programming method of a magnetic random access memory according to claim 30, wherein the second magnetic tunnel junction structure has a second magnetic critical value, the programming method further comprises:
- (III) providing a second current flowing through the first magnetic tunnel junction structure and the second magnetic tunnel junction structure, the absolute value of the second current ranges between the first magnetic critical value and the second magnetic critical value, and the second current flows to the first magnetic tunnel junction structure from the second magnetic tunnel junction structure.

32. The programming method of a magnetic random access memory according to claim 27, wherein the first magnetic tunnel junction structure has a first magnetic critical value, in the step (II), the absolute value of the first current is larger than the first magnetic critical value, and the first current flows to the first magnetic tunnel junction structure from the second magnetic tunnel junction structure.

33. The programming method of a magnetic random access memory according to claim 32, wherein the second magnetic tunnel junction structure has a second magnetic critical value, the programming method further comprises:
- (III) providing a second current flowing through the first magnetic tunnel junction structure and the second magnetic tunnel junction structure, the absolute value of the second current ranges between the first magnetic critical value and the second magnetic critical value, and the second current flows to the second magnetic tunnel junction structure from the first magnetic tunnel junction structure.

34. The programming method of a magnetic random access memory according to claim 27, wherein in the step (I), the first magnetic tunnel junction structure and the second magnetic tunnel junction structure are provided in-series.

* * * * *